(12) United States Patent
Takemura

(10) Patent No.: US 9,804,719 B2
(45) Date of Patent: Oct. 31, 2017

(54) ELECTRONIC DEVICE

(71) Applicant: Semiconductor Energy Laboratory Co., Ltd., Kanagawa-ken (JP)

(72) Inventor: Yasuhiko Takemura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 70 days.

(21) Appl. No.: 14/919,252

(22) Filed: Oct. 21, 2015

(65) Prior Publication Data

US 2016/0117020 A1    Apr. 28, 2016

(30) Foreign Application Priority Data

Oct. 23, 2014  (JP) .................................. 2014-216179

(51) Int. Cl.
G06F 3/044 (2006.01)
G01R 27/00 (2006.01)
G06F 3/041 (2006.01)

(52) U.S. Cl.
CPC ............. *G06F 3/044* (2013.01); *G01R 27/00* (2013.01); *G06F 3/0416* (2013.01)

(58) Field of Classification Search
CPC ........ G06F 3/044; G06F 3/0416; G06F 3/041; G09G 3/2096; G09G 2330/12; G09G 2320/045; G09G 2300/0417; G09G 3/006
See application file for complete search history.

(56) References Cited

U.S. PATENT DOCUMENTS 6,421,445 B1 * 7/2002 Jensen ................... H04H 20/31
                                                             380/241
7,068,333 B2   6/2006 Ohashi et al.
7,088,052 B2   8/2006 Kimura
(Continued)

FOREIGN PATENT DOCUMENTS

JP          4927216 B1    5/2012

OTHER PUBLICATIONS

Hamaguchi, M. et al "A 240Hz-Reporting-Rate 143×81 Mutual-Capacitance Touch-Sensing Analog Front-End IC with 37dB SNR for 1mm-Diameter Stylus," 2014 IEEE International Solid-State Circuits Conference, ISSCC 2014 / Feb. 11, 2014, pp. 214-216.

(Continued)

*Primary Examiner* — Md Saiful A Siddiqui
(74) *Attorney, Agent, or Firm* — Husch Blackwell LLP

(57) ABSTRACT

The accuracy of reading characteristics or data of pixels or memory cells in a matrix device is increased. An electronic device includes a plurality of drive lines, a sense line intersecting the drive lines, a plurality of element devices provided at intersections thereof, a detecting circuit, a decoder, and a driver. The detecting circuit can detect a first physical quantity of the sense line and transmit a digital signal obtained by digitizing the first physical quantity to the decoder. Each of the element devices can change the first physical quantity of the sense line in accordance with a signal of the corresponding drive line. The driver can transmit coded signals based on a Hadamard matrix to the decoder and the drive lines. The decoder can perform arithmetic processing with use of the coded signals and the digital signal and calculate values based on second physical quantities of the element devices.

18 Claims, 15 Drawing Sheets

(56) References Cited

U.S. PATENT DOCUMENTS

| | | | |
|---|---|---|---|
| 8,970,544 B1* | 3/2015 | Mohindra | G06F 3/0416 |
| | | | 345/173 |
| 8,982,091 B1 | 3/2015 | Mohindra | |
| 9,268,683 B1* | 2/2016 | Cronie | G11C 11/565 |
| 2007/0109274 A1* | 5/2007 | Reynolds | G06F 3/041 |
| | | | 345/173 |
| 2008/0312854 A1 | 12/2008 | Chemin et al. | |
| 2011/0234508 A1* | 9/2011 | Oda | G06F 3/044 |
| | | | 345/173 |
| 2013/0211757 A1 | 8/2013 | Miyamoto | |
| 2013/0271426 A1 | 10/2013 | Yumoto et al. | |
| 2014/0149059 A1* | 5/2014 | Miyamoto | G06F 3/044 |
| | | | 702/65 |
| 2016/0117049 A1* | 4/2016 | Sagawai | G06F 3/0418 |
| | | | 345/174 |

OTHER PUBLICATIONS

<http://www.nit.eu/czasopisma/JTIT/2003/2/3.pdf>, H. Evangelaras, et al., "Applications of Hadamard matrices," Journal of Telecommunications and Information Technology, Feb. 2003, p. 3-10.

* cited by examiner

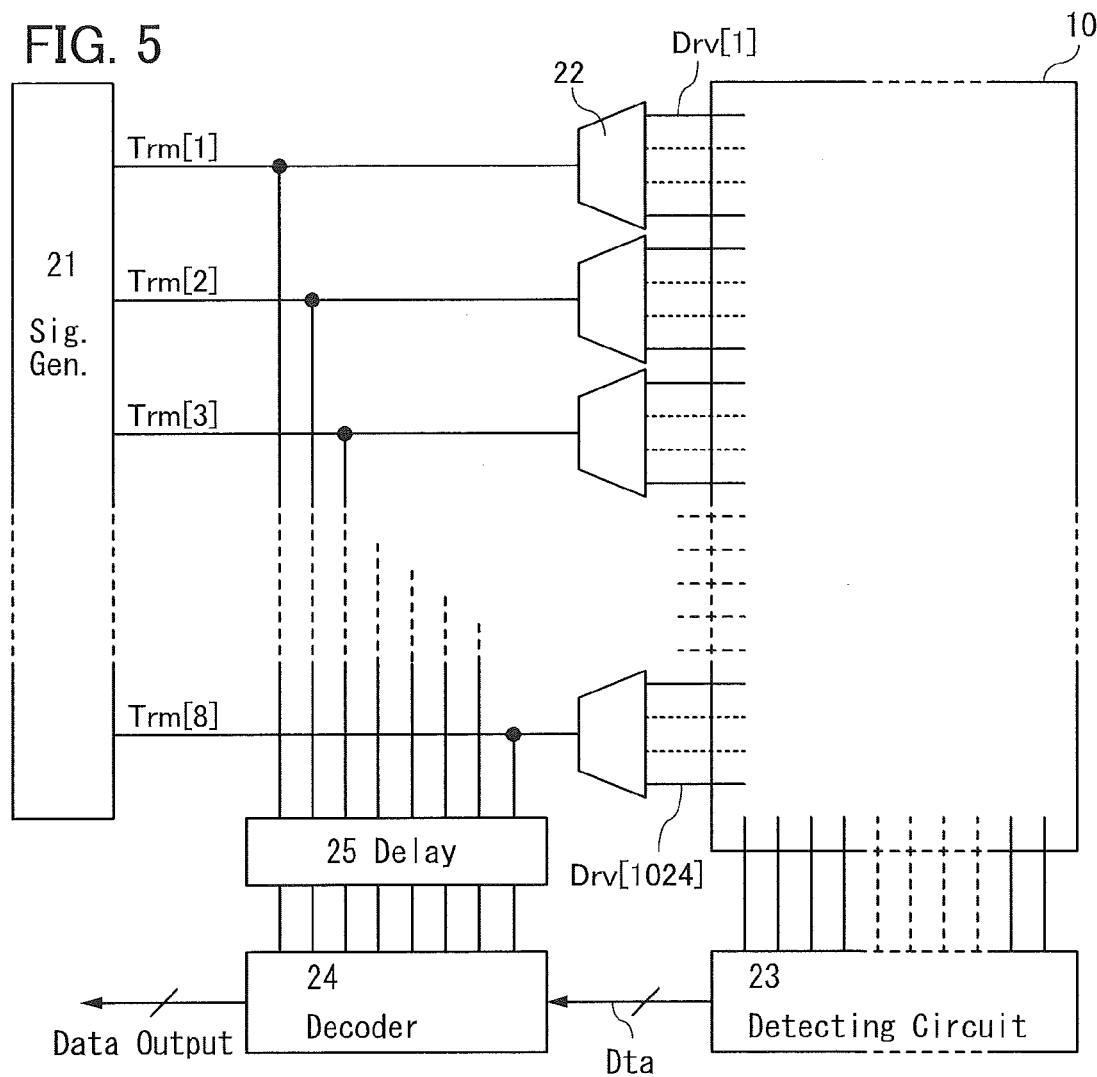

ELECTRONIC DEVICE

BACKGROUND OF THE INVENTION

1. Field of the Invention

This disclosure relates to techniques for performing processing such as detection of a physical quantity (a resistance or a capacitance) of an element device (a pixel, a memory cell, or a constituent electric element thereof) included in a matrix device.

2. Description of the Related Art

Patent Document 1 discloses a technique of applying coded signals to a plurality of signal lines (drive lines) of a matrix device at the same time and detecting a physical quantity (a physical quantity to be measured, a first physical quantity) of another signal line (sense line) intersecting the drive lines, thereby calculating physical quantities (physical quantities to be calculated, second physical quantities) of element devices at intersections of the drive lines and the sense line.

In Patent Document 1, a potential (a voltage) is given as an example of the physical quantity to be measured, and capacitances at the intersections of the drive lines and the sense line are given as an example of the physical quantities to be calculated. In addition, signals based on a Hadamard matrix are given as an example of the coded signals. That is, Patent Document 1 discloses inputting signals, specifically, inputting signals corresponding to elements in the first column of the Hadamard matrix to the drive lines at a first time and inputting signals corresponding to elements in the second column of the Hadamard matrix to the drive lines at a second time.

The accuracy of measurement can be improved particularly when the coded signals are signals based on a Hadamard matrix created by Sylvester's method, whereas Patent Document 1 points out that defective detection is caused because a signal of a particular drive line has permanently the same code.

[Patent Document 1] United States Patent Application Publication No. 2013/0211757

SUMMARY

A novel method of inputting coded signals based on a Hadamard matrix (especially a Hadamard matrix created by Sylvester's method) to a plurality of drive lines and detecting a physical quantity of a sense line, thereby calculating physical quantities of element devices (pixels or memory cells) at intersections of the drive lines and the sense line, a novel device which can employ such a measurement method, a method for setting or manufacturing a device using such a measurement method, or the like is provided.

An electronic device includes N first wirings (drive lines), a second wiring (a sense line) intersecting the N first wirings, first to N-th element devices (including an n-th element device (n is an integer greater than or equal to 1 and less than or equal to N)) provided at intersections of the N first wirings and the second wiring, a detecting circuit, a decoder, and a driver. The detecting circuit is capable of detecting a first physical quantity of the second wiring and transmitting a digital signal obtained by digitizing the first physical quantity to the decoder. Each of the first to N-th element devices is capable of changing the first physical quantity in accordance with a signal of the corresponding one of the N first wirings. The driver is capable of transmitting coded signals based on a Hadamard matrix to the decoder and the N first wirings. The decoder is capable of performing arithmetic processing with use of the coded signals and the digital signal and calculating a value based on a second physical quantity of the n-th element device. Note that the Hadamard matrix may be created by Sylvester's method and have an order which is greater than or equal to 4 and is a power of 2 (4, 8, 16, . . . ). The value based on the second physical quantity of the n-th element device may be calculated as a difference from a value based on a second physical quantity of one of the first to N-th element devices excluding the n-th element device. The first physical quantity may be a current, a potential, or a voltage. The second physical quantity may be a resistance, a capacitance, or a current value. The decoder may include first to N-th arithmetic circuits, and the digital signal and a signal input to one of the N first wirings may be input to each of the arithmetic circuits. A demultiplexer may be provided between the driver and the N first wirings. A delay circuit may be provided between the driver and the decoder. Each of the element devices may be a memory cell capable of storing multi-level data or analog data. The driver may be configured so as not to output coded signals corresponding to the first column of the Hadamard matrix, and the detecting circuit may be configured so as not to detect the first physical quantity of the second wiring at that time.

In one example, the reliability of the physical quantity to be measured can be increased. Other effects can be derived from the description of the specification, the drawings, the claims, and the like.

BRIEF DESCRIPTION OF THE DRAWINGS

FIG. 5 illustrates a configuration example of an electronic device.

DETAILED DESCRIPTION OF THE INVENTION

Figure 1:
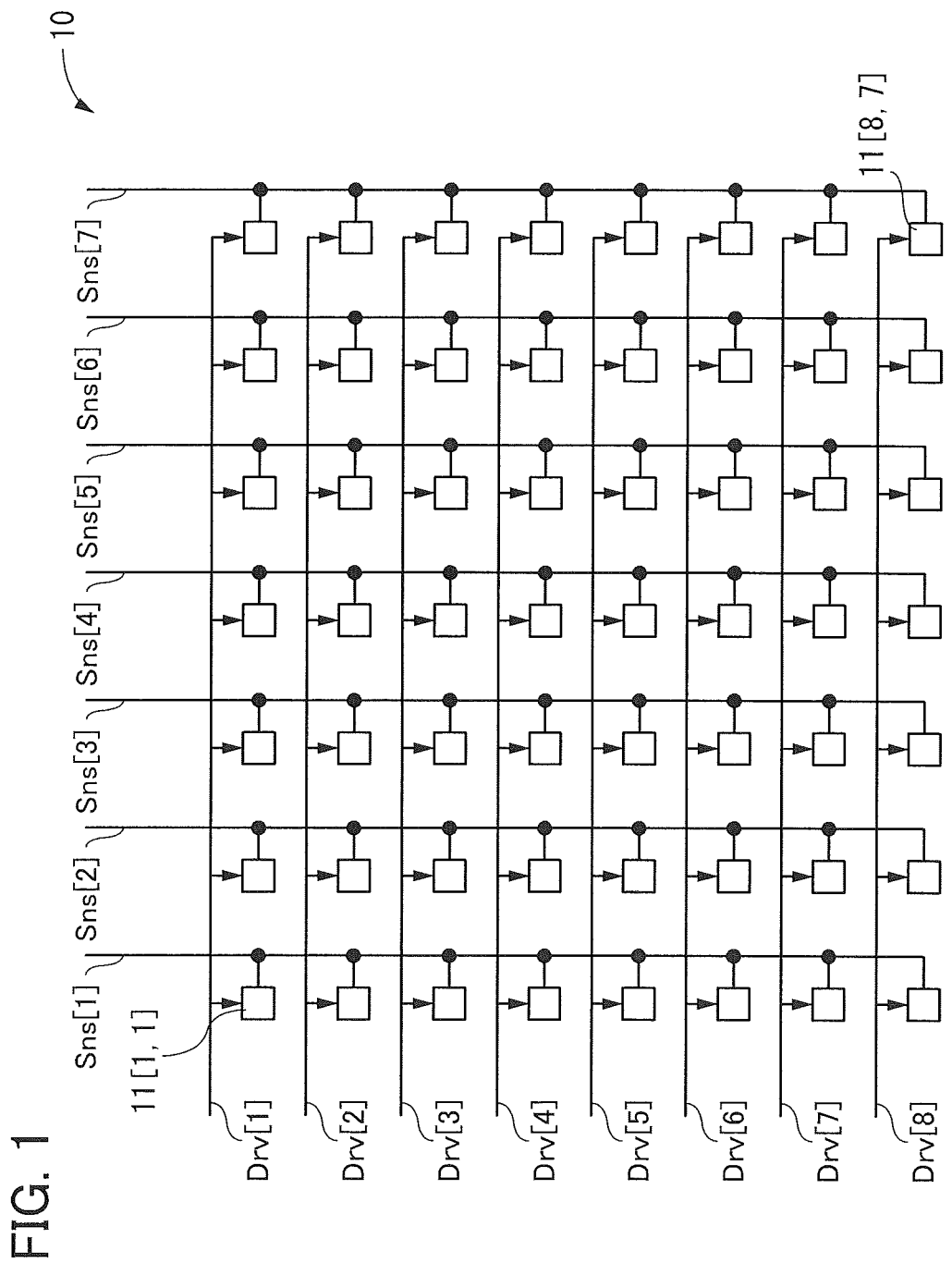
FIG. 1 illustrates a configuration example of a matrix device.

Embodiments will be described in detail below with reference to the accompanying drawings. Note that the embodiments are not limited to the following description, and it will be easily understood by those skilled in the art that various changes and modifications can be made without departing from the spirit and scope and that, for example, techniques in this disclosure can be combined and a technique in this disclosure and a technique other than that can be combined. Therefore, the present invention should not be interpreted as being limited to the following description of the embodiments. In the following embodiments, the same portions or portions having similar functions are denoted by the same reference numerals in different drawings, and explanation thereof will not be repeated.

Examples using a Hadamard matrix of order 8 will be mainly described below; however, the same applies to Hadamard matrices of orders of 4, 16, 32, and higher. Hadamard matrices do not necessarily need to be created by Sylvester's method. Furthermore, the present invention can be similarly carried out using a product obtained by multiplying a Hadamard matrix with a nonzero constant (such as −1).

A technique described in any of the following embodiments can be combined with a technique described in the embodiment, a technique described in another embodiment, or another technique.

Embodiment 1

<Outline of Matrix Device>

FIG. 1 illustrates a matrix device 10 with eight rows and seven columns. Here, a plurality of element devices 11 are arranged in a matrix; for example, an element device 11 in the first row and the first column is described as an element device 11[1,1], and an element device 11 in the eighth row and the seventh column is described as an element device 11[8,7]. A plurality of drive lines Drv and a plurality of sense lines Sns are provided to intersect each other. For example, a drive line Drv in the second row is described as a drive line Drv[2], and a sense line Sns in the first column is described as a sense line Sns[1].

In general, an element device 11 in the n-th row and the m-th column is described as an element device 11[$n,m$], where n is an integer of 1 to 8 and in is an integer of 1 to 7. A drive line Drv in the n-th row and a sense line Sns in the m-th column are described as a drive line Drv[n] and a sense line Sns[m], respectively, where n is an integer of 1 to 8 and in is an integer of 1 to 7. Other wirings, devices, physical quantities, and the like are described in the same manner.

Each of the element devices 11 changes a physical quantity (a first physical quantity) of the corresponding sense line Sns in accordance with a signal of the corresponding drive line Drv. Direct or indirect detection of the first physical quantity makes it possible to calculate a temporary or permanent characteristic or physical property (a second physical quantity) of each of the element devices 11. Examples of the first physical quantity include, but are not limited to, a potential (a voltage), a current, and a magnetic field. Examples of the second physical quantity to be calculated include, but are not limited to, the intensity of electromagnetic waves (light), a saturation current value of a field-effect transistor, a capacitance, a resistance, an inductance, and spins.

Here, as an example, each of the element devices 11 is a memory cell including a magnetic tunnel junction element. Note that an element whose resistance or current value changes in response to a phase change or a change in atomic arrangement or chemical state may be employed instead of the magnetic tunnel junction element. As described later, a large change in resistance or current value is not necessary for a method described in this embodiment; thus, the method can be used for a material or a structure which has been considered to be unsuitable for a memory. The material and structure are likely to be in intermediate states, which might enable multi-level recording.

The magnetic tunnel junction element has a tunnel insulating film between two magnetic layers and has a feature that the amount of a tunnel current is larger when the two magnetic layers are magnetized in the same direction than when they are not (this feature is also referred to as spin tunnel effect). Whether the two magnetic layers are magnetized in the same direction or in different directions is made to correspond to 1 or 0, whereby the magnetic tunnel junction element can be used as a memory. Furthermore, magnetic tunnel junction elements arranged in a matrix can be used as a random access memory (RAM), which is called a spin-transfer torque magnetic RAM (STT-MRAM).

Although the tunnel current of a magnetic tunnel junction element changes in accordance with whether the two magnetic layers are magnetized in the same direction or in different directions, the ratio thereof (on/off ratio) is not sufficiently high and is at most less than 10. To make the ratio 2 or more, the tunnel insulating layer needs to be single crystal, which causes a problem in terms of mass production. Furthermore, miniaturization results in a further decrease of the ratio. For example, the on/off ratio in perpendicular magnetization, which is suitable for miniaturization, is a fraction of that of m-plane magnetization. Furthermore, the tunnel current is proportional to a junction area; when the device is miniaturized, a tunnel current is a fraction of the square of line width. Therefore, a device suitable for mass production does not have a high on/off ratio nor a large absolute value of a tunnel current, and high detection accuracy is required.

Figure 2A:
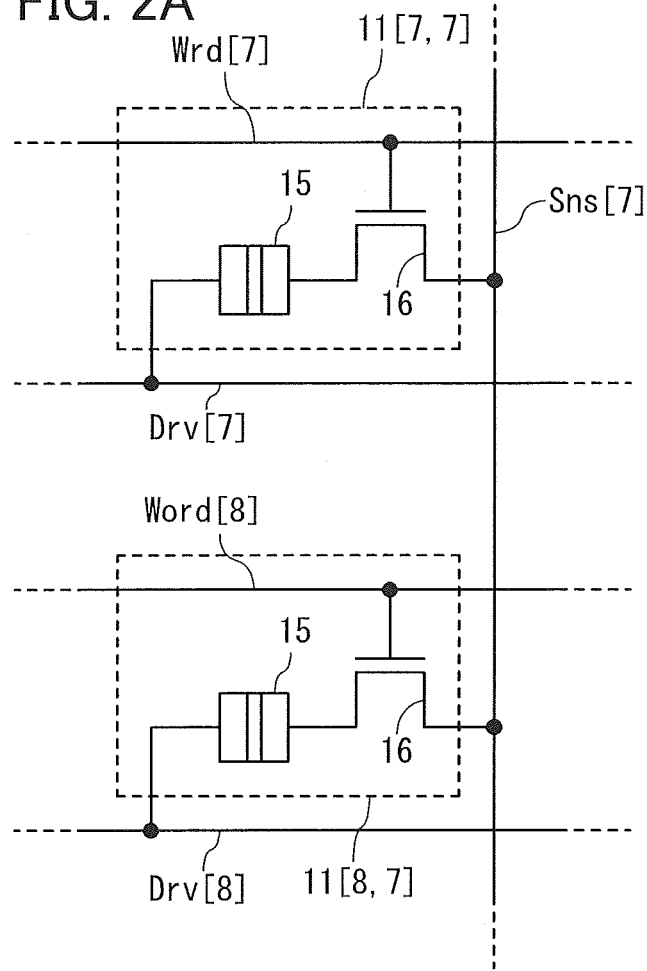
FIGS. 2A to 2C illustrate a circuit example and an operation example of element devices.

The element devices 11 have, for example, a circuit configuration illustrated in FIG. 2A. As illustrated in FIG. 2A, both electrodes of a magnetic tunnel junction element 15 in the element device 11[7,7] and a source and a drain of a transistor 16 are between the sense line Sns[7] and the drive line Drv[7]. Although the source and the drain of the transistor 16 are between the sense line Sns[7] and the magnetic tunnel junction element 15 in FIG. 2A, the source and the drain of the transistor 16 may be between the drive line Drv[7] and the magnetic tunnel junction element 15. The transistor 16 is controlled by a word line Wrd[7]. Instead of the transistor 16, a switch having a similar function may be used. The same applies to the element device 11[8,7] and also to other element devices 11 which are not illustrated in FIG. 2A.

Although the element device 11 in FIG. 2A is an example of a memory cell including the transistor 16, a cross-point memory cell which does not include the transistor 16 may be used. In the absence of a transistor in a memory cell, magnetization cannot be fully achieved in view of interference (crosstalk) with other element devices and therefore the on/off ratio of a tunnel current at the time of reading is low. However, in a method described in this embodiment, such a low on/off ratio does not cause any problem as described later.

Figure 2B:
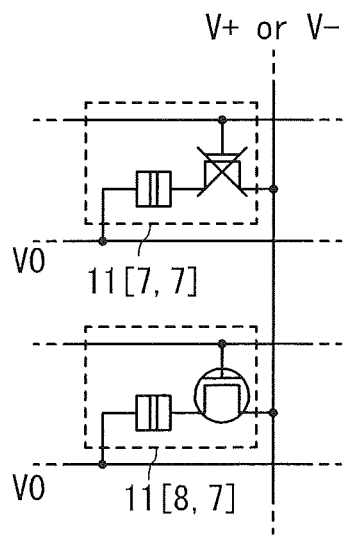

FIG. 2B illustrates a data writing operation. For example, when data is written to the element device 11[8,7], only the transistor 16 in the element device 11[8,7] is turned on, and a current based on the data is supplied to the sense line Sns[7]. For example, the potential of the sense line Sns[7] is set to V+ or V− in accordance with the data, and the potential of the drive line Drv[8] is set to V0. Here, V+ is higher than V0, and V− is lower than V0. Consequently, the direction of current flow in the magnetic tunnel junction element 15 changes with the data, and the direction of magnetization of a storage layer, one of two magnetic layers, of the magnetic tunnel junction element 15 depends on the data.

Figure 2C:
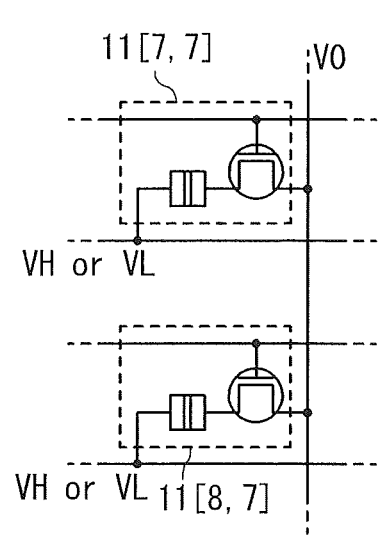

FIG. 2C illustrates a data reading operation. Here, the transistors 16 in the element devices 11[1,7] to 11[8,7] are turned on. The potential of the drive line Drv is set to VH or VL in accordance with a coded signal. Here, VH is higher than V0, and VL is lower than V0. Thus, the potential difference of the magnetic tunnel junction element 15 is VH−V0 or VL−V0; a current generated by this potential difference does not change the direction of magnetization of the storage layer of the magnetic tunnel junction element 15.

In the case where the resistance of the magnetic tunnel junction element 15 is independent of the direction of current flow, the same amount of current can be made to flow in the opposite direction when the average of VH and VL is equal to V0 (i.e., VH−V0=V0−VL). In the case where the resistance of the magnetic tunnel junction element 15 is dependent on the direction of current flow, a correction method described later can be employed.

Note that the magnetic tunnel junction element 15 generally utilizes tunneling and is therefore a nonlinear element. A tunneling current is very small and cannot be measured when the potential difference between terminals is small, but increases significantly after the potential difference exceeds a certain value. Therefore, even when the potential of the drive line Drv and the potential of the sense line Sns are not exactly equal to each other, the current flowing in the magnetic tunnel junction element 15 can be made negligibly small.

For example, when the potential of the drive line Drv[8] is VH, a current flows from the drive line Drv[8] to the sense line Sns[7], and when the potential of the drive line Drv[8] is VL, a current flows from the sense line Sns[7] to the drive line Drv[8]. The direction of current flow is determined by the coded signal supplied at that time. The amount of a current (the current value) i[8,7] of the element device 11[8,7] is dependent on the resistance of the element device 11[8,7] (i.e., data stored therein). The same applies to the other drive lines Drv. Consequently, a current $I[7]_{t=1}$ flowing through the sense line Sns[7] at time t=1 can be represented by $$I[7]_{t=1} = \alpha[1]_{t=1} i[1,7] + \alpha[2]_{t=1} i[2,7] + \ldots + \alpha[8,7]_{t=1} i[8,7]$$

Here, $\alpha[1]_{t=1}, \alpha[2]_{t=1}, \ldots, \alpha[8]_{t=1}$ denote signals applied to the drive lines Drv[1], Drv[2], . . . , Drv[8], respectively, at time t=1.

Note that measurement of the current $I[7]_{t=1}$ includes measurement of potential changes caused by charge entrance into, or charge exit from, capacitors with a predetermined capacitance, and also includes determination of changes in, or magnitude relationships between, permanent or temporary physical quantities (such as potentials, magnetic fields, times, and temperatures) caused directly or indirectly by the current.

Whether the current $I[7]_{t=1}$ is 1, −1, or 0 can be determined, for example, by examining whether the potential of the sense line Sns (potential V0) in a state of being connected only to the element devices 11 and electrically insulated from other wirings (i.e., in a floating state) increases, decreases, or hardly changes in a predetermined period of time.

Note that the current I will be described below using the current value i. The current value i can be uniquely determined by the potential difference (voltage) applied to the element device 11 and by the resistance of the element device 11. Assuming that the same potential difference is applied to the element devices, the current I may be described using the resistance of the element device.

Similarly, a current $I[7]_{t=2}$ at time t=2 can be represented by $$I[7]_{t=2} = \alpha[1]_{t=2} i[1,7] + \alpha[2]_{t=2} i[2,7] + \ldots + \alpha[8,7]_{t=2} i[8,7]$$

In this manner, similar equations are obtained for currents $I[7]_{t=3}$ to $I[7]_{t=7}$ at times t=3 to t=8.

Here, the currents $I[7]_{t=1}$ to $I[7]_{t=7}$ are measurable physical quantities (first physical quantities), and the current values i[1,7] to i[8,7] are unknowns (second physical quantities). These equations are simultaneous equations with eight unknowns. Accordingly, the current values i[1,7] to i[8,7] can be obtained by solving the equations.

The equations are represented by $$\begin{pmatrix} I[7]_{t=1} \\ I[7]_{t=2} \\ I[7]_{t=3} \\ I[7]_{t=4} \\ I[7]_{t=5} \\ I[7]_{t=6} \\ I[7]_{t=7} \\ I[7]_{t=8} \end{pmatrix} = H \begin{pmatrix} i[1,7] \\ i[2,7] \\ i[3,7] \\ i[4,7] \\ i[5,7] \\ i[6,7] \\ i[7,7] \\ i[8,7] \end{pmatrix},$$

where $$H = \begin{pmatrix} \alpha[1]_{t=1} & \alpha[2]_{t=1} & \alpha[3]_{t=1} & \alpha[4]_{t=1} & \alpha[5]_{t=1} & \alpha[6]_{t=1} & \alpha[7]_{t=1} & \alpha[8]_{t=1} \\ \alpha[1]_{t=2} & \alpha[2]_{t=2} & \alpha[3]_{t=2} & \alpha[4]_{t=2} & \alpha[5]_{t=2} & \alpha[6]_{t=2} & \alpha[7]_{t=2} & \alpha[8]_{t=2} \\ \alpha[1]_{t=3} & \alpha[2]_{t=3} & \alpha[3]_{t=3} & \alpha[4]_{t=3} & \alpha[5]_{t=3} & \alpha[6]_{t=3} & \alpha[7]_{t=3} & \alpha[8]_{t=3} \\ \alpha[1]_{t=4} & \alpha[2]_{t=4} & \alpha[3]_{t=4} & \alpha[4]_{t=4} & \alpha[5]_{t=4} & \alpha[6]_{t=4} & \alpha[7]_{t=4} & \alpha[8]_{t=4} \\ \alpha[1]_{t=5} & \alpha[2]_{t=5} & \alpha[3]_{t=5} & \alpha[4]_{t=5} & \alpha[5]_{t=5} & \alpha[6]_{t=5} & \alpha[7]_{t=5} & \alpha[8]_{t=5} \\ \alpha[1]_{t=6} & \alpha[2]_{t=6} & \alpha[3]_{t=6} & \alpha[4]_{t=6} & \alpha[5]_{t=6} & \alpha[6]_{t=6} & \alpha[7]_{t=6} & \alpha[8]_{t=6} \\ \alpha[1]_{t=7} & \alpha[2]_{t=7} & \alpha[3]_{t=7} & \alpha[4]_{t=7} & \alpha[5]_{t=7} & \alpha[6]_{t=7} & \alpha[7]_{t=7} & \alpha[8]_{t=7} \\ \alpha[1]_{t=8} & \alpha[2]_{t=8} & \alpha[3]_{t=8} & \alpha[4]_{t=8} & \alpha[5]_{t=8} & \alpha[6]_{t=8} & \alpha[7]_{t=8} & \alpha[8]_{t=8} \end{pmatrix}.$$

The equations are also represented by $$\begin{pmatrix} i[1,1] \\ i[2,1] \\ i[3,1] \\ i[4,1] \\ i[5,1] \\ i[6,1] \\ i[7,1] \\ i[8,1] \end{pmatrix} = H^{-1} \begin{pmatrix} I[1]_{t=1} \\ I[1]_{t=2} \\ I[1]_{t=3} \\ I[1]_{t=4} \\ I[1]_{t=5} \\ I[1]_{t=6} \\ I[1]_{t=7} \\ I[1]_{t=8} \end{pmatrix},$$

where $H^{-1}$ is an inverse matrix of the matrix H.

Although focus is placed on only the seventh column in the above description, if currents flowing through the other sense lines Sns can be measured at the same time at times t=1 to t=8, $$I = Ht,$$

where $$I = \begin{pmatrix} I[1]_{t=1} & I[2]_{t=1} & I[3]_{t=1} & I[4]_{t=1} & I[5]_{t=1} & I[6]_{t=1} & I[7]_{t=1} \\ I[1]_{t=2} & I[2]_{t=2} & I[3]_{t=2} & I[4]_{t=2} & I[5]_{t=2} & I[6]_{t=2} & I[7]_{t=2} \\ I[1]_{t=3} & I[2]_{t=3} & I[3]_{t=3} & I[4]_{t=3} & I[5]_{t=3} & I[6]_{t=3} & I[7]_{t=3} \\ I[1]_{t=4} & I[2]_{t=4} & I[3]_{t=4} & I[4]_{t=4} & I[5]_{t=4} & I[6]_{t=4} & I[7]_{t=4} \\ I[1]_{t=5} & I[2]_{t=5} & I[3]_{t=5} & I[4]_{t=5} & I[5]_{t=5} & I[6]_{t=5} & I[7]_{t=5} \\ I[1]_{t=6} & I[2]_{t=6} & I[3]_{t=6} & I[4]_{t=6} & I[5]_{t=6} & I[6]_{t=6} & I[7]_{t=6} \\ I[1]_{t=7} & I[2]_{t=7} & I[3]_{t=7} & I[4]_{t=7} & I[5]_{t=7} & I[6]_{t=7} & I[7]_{t=7} \\ I[1]_{t=8} & I[2]_{t=8} & I[3]_{t=8} & I[4]_{t=8} & I[5]_{t=8} & I[6]_{t=8} & I[7]_{t=8} \end{pmatrix}$$

and $$t = \begin{pmatrix} i[1,1] & i[1,2] & i[1,3] & i[1,4] & i[1,5] & i[1,6] & i[1,7] \\ i[2,1] & i[2,2] & i[2,3] & i[2,4] & i[2,5] & i[2,6] & i[2,7] \\ i[3,1] & i[3,2] & i[3,3] & i[3,4] & i[3,5] & i[3,6] & i[3,7] \\ i[4,1] & i[4,2] & i[4,3] & i[4,4] & i[4,5] & i[4,6] & i[4,7] \\ i[5,1] & i[5,2] & i[5,3] & i[5,4] & i[5,5] & i[5,6] & i[5,7] \\ i[6,1] & i[6,2] & i[6,3] & i[6,4] & i[6,5] & i[6,6] & i[6,7] \\ i[7,1] & i[7,2] & i[7,3] & i[7,4] & i[7,5] & i[7,6] & i[7,7] \\ i[8,1] & i[8,2] & i[8,3] & i[8,4] & i[8,5] & i[8,6] & i[8,7] \end{pmatrix}.$$

Hence, $$t = H^{-1}I.$$

That is, a current value i[n,m] can be expressed as a polynomial of a current $I[m]_{t=j}$ and $\alpha[n]_{t=j}$. Here, n and j are each individually an integer of 1 to 8, and in is an integer of 1 to 7.

Although the above description relates to a matrix device with eight rows and seven columns, it can also be similarly applied to a matrix device with an arbitrary scale. That is, in a matrix device with N rows and M columns, a matrix H is a square matrix with N rows, and a matrix I and a matrix t, are each individually a matrix with N rows and M columns.

The current I will be regarded as a numeric value below. Thus, the expression "to input the current I to a decoder" means inputting a numeric value as the current I to a decoder. Here, the current I is not limited to an analog value and may be a digital value. For example, the current I may be a numeric value obtained by digitizing a current flowing through the sense line Sns. The current value i is also not limited to an analog value and may be a digital value.

Here, the matrix H may be a matrix whose elements are either 1 or −1. This means that the direction of current flow changes with coded signals. It is assumed in the following discussion that the amount of current does not change even when the direction of current flow changes. Note that a correction to be made in the case where the amount of current changes with the direction of current flow will be described later.

As the matrix whose elements are either 1 or −1, a Hadamard matrix created by Sylvester's method (hereinafter referred to as a Hadamard matrix) can be employed.

For example, at time t=j (where j is an integer of 1 to 8), signals corresponding to eight elements in the j-th column of the Hadamard matrix are input to the drive lines Drv[1] to Drv[8], respectively. This means that eight elements ($h_{1,n}$ to $h_{8,n}$) in the n-th row of the Hadamard matrix are sequentially input to the drive line Drv[n] (n is an integer of 1 to 8). Such sets of signals are referred to as coded signals based on the Hadamard matrix.

As for the Hadamard matrix, the sum of the elements in every row and column excluding the first row and the first column is 0. Therefore, when the coded signals based on the Hadamard matrix are used, the amount of each of the currents $I[7]_{t=2}$ to $I[7]_{t=8}$ is at most approximately eight (the order of the Hadamard matrix here) times the standard deviation of the current values i[1,7] to i[8,7]. Note that the current $I[7]_{t=1}$ is the sum of the current values i[1,7] to i[8,7], which is significantly large. Operation in that case will be described later.

An inverse matrix $H^{-1}$ of a Hadamard matrix H of order N is one N-th of H. This means that the current value i[8,7], for example, is obtained by dividing the added and/or subtracted values of the currents $I[7]_{t=1}$ to $I[7]_{t=8}$ by 8, and has substantially the same effect as measuring each current value eight times (that is, the effect of making the error approximately 0.36 times) when the currents $I[7]_{t=1}$ to $I[7]_{t=8}$ are substantially equal to each other. In general, the effect of making the error a fraction of the square root of N can be obtained when the difference between the maximum value and the minimum value of currents to $I[m]_{t=1}$ to $I[m]_{t=N}$ is approximately 1/N.

Note that in actual data processing, it is acceptable as long as numeric values can be relatively compared; thus, calculation may be conducted using the inverse matrix $H^{-1}$ of the Hadamard matrix H of order N as H for simpler calculation. In that case, the current value i[8,7] can be calculated simply by the addition and/or subtraction of the currents $I[7]_{t=1}$ to $I[7]_{t=8}$.

Note that the Hadamard matrix of order 8 can be applied to the above-described matrix device with eight rows. The orders of Hadamard matrices are powers of 2, e.g., 4, 8, and 16. However, there may be a matrix device with 14 rows, for example.

In that case, for example, the matrix device may be divided into the first to eighth rows and the seventh to fourteenth rows, on each of which measurement similar to the above is performed. In this case, the seventh row and the eighth row are subjected to the measurement twice, and thus two results are obtained. One of the two results may be employed, or the average value thereof may be used as the result. Furthermore, it is necessary that current be not supplied to the sense lines Sns from the element devices 11 in the ninth to fourteenth rows in a period during which measurement of characteristics of the first to eighth rows is performed.

Note that it can be easily understood that the same conclusion can be drawn when given rows in the matrix H are interchanged with each other (interchanging rows means only changing the order of the simultaneous equations with multiple unknowns; therefore, their solutions do not change).

In a larger-scale matrix device, the number of drive lines Drv to which the coded signals are input at the same time may be increased with the number of rows, or the number of drive lines Drv to which the coded signals are input at the same time may be limited so that current does not practically flow between the drive lines Drv to which the coded signals are not input and the sense lines Sns. In the example of the element device 11 illustrated in FIG. 2A, the potential of the drive line Drv to which the coded signal is not input is set to V0, for example. Alternatively, the transistor 16 of the element device 11 is turned off.

Figure 3A:
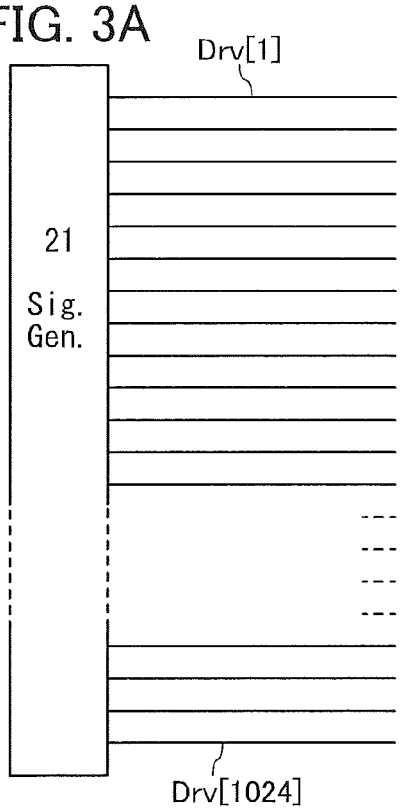
FIGS. 3A and 3B each illustrate a configuration example of an electronic device.
Figure 3B:
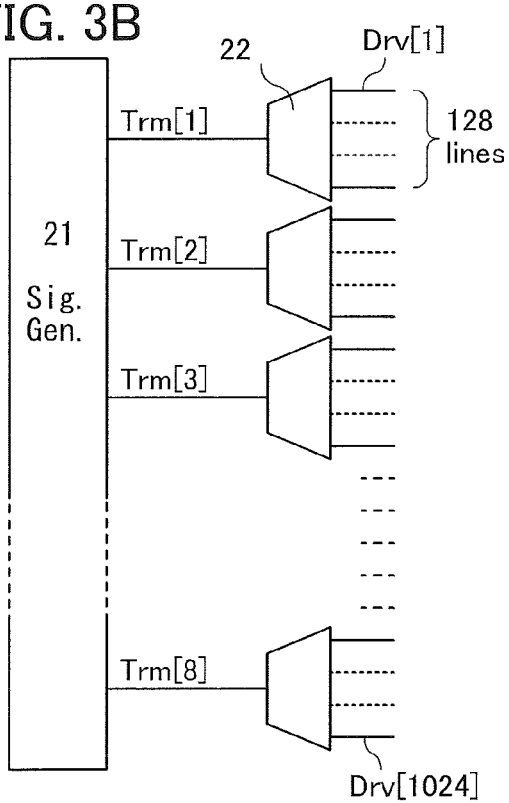

Note that signals may be directly input to the drive lines Drv from a signal generation circuit 21 as in an electronic device illustrated in FIG. 3A, or a signal from the signal generation circuit 21 may be input to one drive line Drv which is selected by a demultiplexer 22 as in an electronic device illustrated in FIG. 3B. In FIG. 3B, one of 128 drive lines Drv is selected.

The signal generation circuit 21 illustrated in FIG. 3B has a function of outputting signals corresponding to rows of the matrix H to a plurality of terminals Trm[1] to Trm[8], respectively. For example, when the matrix H has eight rows, eight kinds of signals (corresponding to the eight rows of the matrix II) are output to eight terminals Trm[1] to Trm[8] in accordance with a reference signal such as a clock signal.

In the case where the matrix device has, for example, 1024 rows, each of these eight signals is output via a corresponding 7-bit demultiplexer 22 to any of the corresponding 128 drive lines Drv.

The drive line Drv may be either a single wiring or a plurality of wirings. For example, one drive line Drv may be composed of two wirings.

<Data Reading Method—Basis>

Next, data reading will be described. Here, the amount of current which flows in the magnetic tunnel junction element 15 of each of the element devices 11 is 1.1 ρA when data is "1" and 0.9 ρA when data is "0". In that case, the current ratio (resistance ratio) based on the different data is approximately 1.2. Although it is difficult to accurately read data when the resistance ratio is low as described above, data can be accurately calculated, as described below, by using the current I that is output in accordance with the coded signals.

A current is converted by an AD converter and classified into, for example, three states of being 0, positive, and negative. Specifically, a current which flows in a direction from the drive line Drv to the sense line Sns is regarded as positive; a current of 0.1 ρA or more is determined to be 1, a current of −0.1 µA or less is determined to be −1, and a current therebetween is determined to be 0. Thus, the determination can be achieved using two comparators. The accuracy of AD conversion in that case is 0.2 µA.

In the case where there is less variation among current values, for example, a current of 0.15 µA or more may be determined to be 1, a current of −0.15 µA or less may be determined to be 1, and a current therebetween may be determined to be 0. The accuracy of AD conversion in that case is 0.3 µA, which is larger than a difference (0.2 µA) between a current value based on data "1" and a current value based on data "0". It is needless to say that more accurate AD conversion may be performed.

For example, the element device 11[1,1], the element device 11[2,1], the element device 11[3,1], the element device 11[4,1], the element device 11[5,1], the element device 11[6,1], the element device 11[7,1], and the element device 11[8,1] store first data "1", "0", "0", "1", "1", "0", "0", and "0", respectively.

The Hadamard matrix of order 8 is represented by $$H = \begin{pmatrix} 1 & 1 & 1 & 1 & 1 & 1 & 1 & 1 \\ 1 & -1 & 1 & -1 & 1 & -1 & 1 & -1 \\ 1 & 1 & -1 & -1 & 1 & 1 & -1 & -1 \\ 1 & -1 & -1 & 1 & 1 & -1 & -1 & 1 \\ 1 & 1 & 1 & 1 & -1 & -1 & -1 & -1 \\ 1 & -1 & 1 & -1 & -1 & 1 & -1 & 1 \\ 1 & 1 & -1 & -1 & -1 & -1 & 1 & 1 \\ 1 & -1 & -1 & 1 & -1 & 1 & 1 & -1 \end{pmatrix}.$$

Therefore, currents flowing through the sense line Sns[1] at times t=1 to t=8 are 7.8 µA, 0.2 µA, 0.2 µA, 0.6 µA, 0.2 µA, −0.2 µA, −0.2 µA, and 0.2 µA, respectively, in an ideal state which is free from variation among the element devices and the like.

In the first column of the Hadamard matrix, all the elements are 1; thus, at time t=1, currents flow from all the element devices in the same direction, leading to an abnormal value. The flow of a large amount of current increases power consumption yet does not affect the result as described below. Therefore, no particular measurement is performed (i.e., the coded signals are not supplied), or even if the coded signals are supplied, the value is not employed and the current $I[1]_{t=1}$ is constantly set to 0. The reason for this operation will be described later.

The currents at times t=2 to t=8 are measured and converted by an AD converter. As a result, data 0, 1, 1, 1, 1, −1, −1, and 1 are obtained as the currents $I[1]_{t=1}$ to $I[1]_{t=8}$ flowing through the sense line Sns[1].

The data stored in the element devices 11 can be calculated by multiplying the inverse matrix of the Hadamard matrix of order 8 by the currents $I[1]_{t=1}$ to $I[1]_{t=8}$. The resulting calculated data are 0.375, −0.125, −0.125, 0.375, 0.375, −0.125, −0.125, and −0.125. Here, attention is paid only to whether the values are positive or negative, and a positive value and a negative value are regarded as data "1" and "0", respectively. That is, data "1", "0", "0", "1", "1", "0", "0", and "0" are read, which are identical with the data stored.

Alternatively, the element device 11[1,1], the element device 11[2,1], the element device 11[3,1], the element device 11[4,1], the element device 11[5,1], the element device 11[6,1], the element device 11[7,1], and the element device 11[8,1] store second data "0", "1", "1", "0", "0", "0", "0", and "0", respectively. The currents flowing through the sense line Sns[1] at times t=1 to t=8 are 7.6 µA, 0 µA, 0 µA, −0.4 µA, 0.4 µA, 0 µA, 0 µA, and −0.4 µA, respectively, in an ideal state which is free from variation among the element devices and the like.

These currents are subjected to AD conversion as described above, and data 0, 0, 0, −1, 1, 0, 0, and −1 are obtained as the currents $I[1]_{t=1}$ to $[1]_{t=8}$ flowing through the sense line Sns[1]. Calculated data based on the above data are −0.125, 0.375, 0.375, −0.125, −0.125, −0.125, −0.125, and −0.125, and data "0", "1", "1", "0", "0", "0", "0", and "0" are read.

Although a coefficient ⅛ of the inverse matrix of the Hadamard matrix is taken into consideration in the above calculation, this coefficient can be ignored. In that case, the calculation involves only addition and/or subtraction and can be simplified. When the above-described first data are subjected to calculation with the coefficient ignored, the calculated data are 3, −1, −1, 3, 3, −1, −1, and −1. When attention is paid only to whether the values are positive or negative and a positive value and a negative value are regarded as data "1" and "0", respectively, data "1", "0", "0", "1", "1", "0", "0", and "0" are read, which are identical with the data stored.

<Data Reading Method—Modification 1>

The above method has the disadvantage of not being capable of determining whether data is "1" or "0" when all the element devices 11 store the same data. Specifically, calculated data are 0, 0, 0, 0, 0, 0, 0, and 0 either when all data are "1" or when they are "0". Note that the other data do not yield such calculated data.

This can be avoided, for example, by constant writing of "1" (or "0") to the element device 11[1,1]. In that case, it is the seven element devices 11[2,1] to 11[8,1] that can be used by a user. The case of constant writing of "1" to the element device 11[1,1] is distinguishable from other cases because all calculated data are 0 when data "1" is written to all the other element devices.

<Data Reading Method—Modification 2>

In the above-described method, data stored in the element devices 11 are individually calculated. When data of one element device is known, the other data can be estimated by a relative comparison with the known data.

From a feature of the Hadamard matrix of order 8, the current $I[1]_{t=1}$ can be represented by $$I[1]_{t=1} = i[1,1] + i[2,1] + i[3,1] + \ldots + i[8,1].$$

The current value i[1,1] can be represented by $$i[1, 1] = \frac{1}{8}(I[1]_{t=1} + I[1]_{t=2} + I[1]_{t=3} + \ldots + I[1]_{t=8}).$$

The current value i[2,1] can be represented by $$i[2, 1] = \frac{1}{8}(I[1]_{t=1} - I[1]_{t=2} + I[1]_{t=3} - \ldots - I[1]_{t=8}).$$

Although each of them is a polynomial including the current $I[1]_{t=1}$, the value of the current $I[1]_{t=1}$ does not necessarily need to be known as described below when the current value i[1,1] and the current value i[2,1] are compared.

That is, from the current values i[1,1] and i[2,1], $$i[2, 1] - i[1, 1] = -\frac{1}{4}(I[1]_{t=2} + I[1]_{t=4} + I[1]_{t=6} + I[1]_{t=8})$$

can be derived. In other words, the current value i[2,1] can be relatively compared with the current value i[1,1]. For example, when data corresponding to the current value i[1,1] is "1" and the current value i[2,1] is smaller than the current value i[1,1], the corresponding data can be determined to be "0", otherwise it is determined to be "1". It is noteworthy that the equation does not involve the current value $I[1]_{t=1}$, and this means that the current $I[1]_{t=1}$ can be ignored (or set to 0 in the above subsection <Data reading method Basis>).

This can be further generalized, and a current value i[n,1] of an element device 11 in the n-th row (n is an integer of 2 to 8) can be represented by $$i[n, 1] = i[1, 1] + \frac{1}{8}\{(h_{2,n} - 1)I[1]_{t=2} + (h_{3,n} - 1)I[1]_{t=3} + \ldots + (h_{8,n} - 1)I[1]_{t=8}\},$$

where $h_{2,n}, h_{3,n}, \ldots, h_{8,n}$ are elements in the second row and the n-th column to the eighth row and the n-th column, respectively, of the Hadamard matrix of order 8.

Hence, $$\begin{pmatrix} i[2,1] - i[1,1] \\ i[3,1] - i[1,1] \\ \vdots \\ \vdots \\ i[8,1] - i[1,1] \end{pmatrix} = \frac{1}{8} \begin{pmatrix} h_{2,2}-1 & h_{2,3}-1 & \ldots & \ldots & h_{2,8}-1 \\ h_{3,2}-1 & h_{3,3}-1 & & & \vdots \\ \vdots & & \vdots & & \vdots \\ \vdots & & & \vdots & \vdots \\ h_{8,2}-2 & \ldots & \ldots & \ldots & h_{8,8}-1 \end{pmatrix} \begin{pmatrix} I[1]_{t=2} \\ I[1]_{t=3} \\ \vdots \\ \vdots \\ I[1]_{t=8} \end{pmatrix}$$

$$= -\frac{1}{4}\begin{pmatrix} 1 & 0 & 1 & 0 & 1 & 0 & 1 \\ 0 & 1 & 1 & 0 & 0 & 1 & 1 \\ 1 & 1 & 0 & 0 & 1 & 1 & 0 \\ 0 & 0 & 0 & 1 & 1 & 1 & 1 \\ 1 & 0 & 1 & 1 & 0 & 1 & 0 \\ 0 & 1 & 1 & 1 & 1 & 0 & 0 \\ 1 & 1 & 0 & 1 & 0 & 0 & 1 \end{pmatrix} \begin{pmatrix} I[1]_{t=2} \\ I[1]_{t=3} \\ \vdots \\ \vdots \\ I[1]_{t=8} \end{pmatrix}$$

$$= -\frac{1}{4}H_A \begin{pmatrix} I[1]_{t=2} \\ I[1]_{t=3} \\ \vdots \\ \vdots \\ I[1]_{t=8} \end{pmatrix}.$$

This equation can be used to obtain differences of the current values i[2,1] to i[8,1] from the current value i[1,1]. For example, it is assumed that data corresponding to the first data are written to the element devices 11[2,1] to 11[8,1] and data "1" is constantly written to the element device 11[1,1]. When the currents flowing through the sense line Sns[1] at times t=2 to t=8 (0 μA, 0 μA, −0.4 μA, 0.4 μA, 0 μA, 0 μA, and −0.4 μA) are substituted into the above equation, the difference between the current value i[1,1] and each of the current values i[4,1] and i[5,1] is 0 and the difference between the current value i[1,1] and each of the others is −0.5. This indicates that the element devices 11[4,1] and 11[5,1] store data "1" and the other element devices 11 store data "0".

Also in that case, it is the seven element devices 11[2,1] to 11[8,1] that can be used by a user.

The above-described matrix $H_A$ with seven rows and seven columns is obtained by replacing −1 with 0 in a submatrix obtained by removing the first row and the first column from the Hadamard matrix of order 8. Therefore, a circuit for executing this operation and a procedure of the operation can be simplified as described later.

In the above-described example, the differences of the current values i[2,1] to i[8,1] from the current value i[1,1] are calculated. In general, polynomials of the current values i[1,1] to i[8,1] have the same first term (the term of the current $I[1]_{t=1}$); therefore, the difference between any two of the current values i[1,1] to i[8,1] can be obtained.

<Data Reading Method—Modification 3>

In the above-described example, the current I is read by an AD converter as any of three values of a positive value, a negative value, and 0. This is because when an even number of element devices 11 of the above-described eight element devices 11[1,1] to 11[8,1] store the same data, any of the currents $I[1]_{t=2}$ to $I[1]_{t=8}$ becomes 0. This does not occur when an odd number of element devices 11 store the same data; therefore, the current I is read as a positive or negative value, whereby a simpler circuit configuration and a simpler operation can be achieved.

In view of this, any one of the eight element devices 11[1,1] to 11[8,1] is made to store "1" or "0" in accordance with the data of the other seven element devices 11 so that an odd number of element devices 11 store the same data. For example, in the case where the element device 11[1,1] is used for this purpose and none of, or an even number of, the other seven element devices 11 store data "1" (i.e., an odd number of element devices store data "0"), data "1" is written to the element device 11[1,1]. In the other cases, data "0" is written thereto.

As an inevitable result, not all the elements 11[1,1] to 11[8,1] store the same data; therefore, the problem described above in the subsection <Data reading method—Modification 1> does not arise. Also in that case, it is the seven element devices 11[2,1] to 11[8,1] that can be used by a user.

This method can further increase the accuracy of reading. For example, it is assumed that data "0", "0", "1", "1", "0", "0", and "0" are written to the element device 11[2,1], the element device 11[3,1], the element device 11[4,1], the element device 11[5,1], the element device 11[6,1], the element device 11[7,1], and the element device 11 [8,1], respectively. Since there are an odd number of data "1", data "1" is written to the element device 11[1,1].

Note that the current values of the element device 11[1,1], the element device 11[2,1], the element device 11[3,1], the element device 11[4,1], the element device 11[5,1], the element device 11[6,1], the element device 11[7,1], and the element device 11[8,1] vary and are 1.05 µA, 0.93 µA, 0.89 µA, 1.02 µA, 1.07 µA, 0.96 µA, 0.91 µA, and 0.92 µA, respectively.

The amounts of currents flowing through the sense line Sns[1] at times t=1 to t=8 are 7.75 µA (set to 0 as described above), 0.09 µA, 0.27 µA, 0.37 µA, 0.03 µA, −0.11 µA, −0.13 µA, and 0.13 µA, respectively. These values become 0, 1, 1, 1, −1, −1, and 1 as a result of AD conversion or the like. The resulting calculated data are 0.375, −0.125, −0.125, 0.375, 0.375, −0.125, −0.125, and −0.125, and data "1", "0", "0", "1", "1", "0" "0" and "0" are read.

Note that this method may be combined with the method described in the subsection <Data reading method—Modification 2>. For example, reference data is written to the element device 11[1,1], and data "1" or "0" is written to the element device 11[2,1] in accordance with data of the element device 11[1,1] and the element devices 11[3,1] to 11[8,1]. Therefore, it is the element devices 11[3,1] to 11[8,1] that can be used by a user.

<Data Reading Method—Modification 4>

In contrast to <Data reading method—Modification 3>, the number of data "1" (or data "0") may be set to an even number. In that case, any of the currents I[1]$_{t=2}$ to I[1]$_{t=8}$ is 0, whereas the amount of the current I which is not 0 is 0.4 µA or more. That is, the accuracy of AD conversion can be lowered.

For example, a current of 0.2 µA or more can be determined to be 1, a current of −0.2 µA or less can be determined to be −1, and a current therebetween can be determined to be 0. The accuracy of AD conversion in that case is 0.4 µA, which is twice a difference (0.2 µA) between a current value based on data "1" and a current value based on data "0". Note that it is necessary that the current detection accuracy be 0.2 µA or less (a difference in current of 0.2 µA can be detected) in the case where data are read individually.

Note that the same applies to the case where the number of data "1" (or data "0") is set to an odd number (the difference between any two of the currents I[1]$_{t=2}$ to I[1]$_{t=8}$ is 0.4 µA or more in the case where the number of data "1" is set to an odd number).

<Correction Method for Asymmetry>

In the above method, the amount of current is assumed to be constant (symmetric) even when the direction of current flow in the magnetic tunnel junction element 15 is reversed, but might be asymmetric under the influence of various factors. For example, in the case where a current flows in the negative direction in the element device 11[n,1] (n is an integer of 1 to 8), the amount of current is $\beta_{n,1}$ (>0) times that in the case where a current flows in the positive direction. In that case, a correction is made to a Hadamard matrix to be used. For example, when a Hadamard matrix of order 8 is used, an element which is −1 is replaced with $\beta_{n,1}$. A corrected Hadamard matrix H' is represented by $$H' = \begin{pmatrix} 1 & 1 & 1 & 1 & 1 & 1 & 1 & 1 \\ 1 & -\beta_{2,1} & 1 & -\beta_{4,1} & 1 & -\beta_{6,1} & 1 & -\beta_{8,1} \\ 1 & 1 & -\beta_{3,1} & -\beta_{4,1} & 1 & 1 & -\beta_{7,1} & -\beta_{8,1} \\ 1 & -\beta_{2,1} & -\beta_{3,1} & 1 & 1 & -\beta_{6,1} & -\beta_{7,1} & 1 \\ 1 & 1 & 1 & 1 & -\beta_{5,1} & -\beta_{6,1} & -\beta_{7,1} & -\beta_{8,1} \\ 1 & -\beta_{2,1} & 1 & -\beta_{4,1} & -\beta_{5,1} & 1 & -\beta_{7,1} & 1 \\ 1 & 1 & -\beta_{3,1} & -\beta_{4,1} & -\beta_{5,1} & -\beta_{6,1} & 1 & 1 \\ 1 & -\beta_{2,1} & -\beta_{3,1} & 1 & -\beta_{5,1} & 1 & 1 & -\beta_{8,1} \end{pmatrix}.$$

As is apparent from the equation, the value of $\beta_{n,1}$ can be set for each of the element devices 11.

An inverse matrix $H'^{-1}$ of this matrix is represented by $$H'^{-1} = \frac{1}{8}\begin{pmatrix} \delta_1 & \delta_2 & \delta_3 & \delta_4 & \delta_5 & \delta_6 & \delta_7 & \delta_8 \\ \gamma_{2,1} & -\gamma_{2,1} & \gamma_{2,1} & -\gamma_{2,1} & \gamma_{2,1} & -\gamma_{2,1} & \gamma_{2,1} & -\gamma_{2,1} \\ \gamma_{3,1} & \gamma_{3,1} & -\gamma_{3,1} & -\gamma_{3,1} & \gamma_{3,1} & \gamma_{3,1} & -\gamma_{3,1} & -\gamma_{3,1} \\ \gamma_{4,1} & -\gamma_{4,1} & -\gamma_{4,1} & \gamma_{4,1} & \gamma_{4,1} & -\gamma_{4,1} & -\gamma_{4,1} & \gamma_{4,1} \\ \gamma_{5,1} & \gamma_{5,1} & \gamma_{5,1} & \gamma_{5,1} & -\gamma_{5,1} & -\gamma_{5,1} & -\gamma_{5,1} & -\gamma_{5,1} \\ \gamma_{6,1} & -\gamma_{6,1} & \gamma_{6,1} & -\gamma_{6,1} & -\gamma_{6,1} & \gamma_{6,1} & -\gamma_{6,1} & \gamma_{6,1} \\ \gamma_{7,1} & \gamma_{7,1} & -\gamma_{7,1} & -\gamma_{7,1} & -\gamma_{7,1} & -\gamma_{7,1} & \gamma_{7,1} & \gamma_{7,1} \\ \gamma_{8,1} & -\gamma_{8,1} & -\gamma_{8,1} & \gamma_{8,1} & -\gamma_{8,1} & \gamma_{8,1} & \gamma_{8,1} & -\gamma_{8,1} \end{pmatrix},$$

where $$\gamma_{n,1} = \frac{2}{1 + \beta_{n,1}}$$

and $$\delta_1 = 8 - \sum_{n=2}^{8} \gamma_{n,1}.$$

Note that $\delta_2$ to $\delta_8$ are each a value with which the sum of elements in the corresponding column becomes 0:

$\delta_2 - \gamma_{2,1} + \gamma_{3,1} - \gamma_{4,1} + \gamma_{5,1} - \gamma_{6,1} + \gamma_{7,1} - \gamma_{8,1} = 0$ $\delta_3 - \gamma_{2,1} - \gamma_{3,1} - \gamma_{4,1} + \gamma_{5,1} + \gamma_{6,1} - \gamma_{7,1} + \gamma_{8,1} = 0$ $\delta_4 - \gamma_{2,1} - \gamma_{3,1} - \gamma_{4,1} + \gamma_{5,1} - \gamma_{6,1} - \gamma_{7,1} + \gamma_{8,1} = 0$ $\delta_5 + \gamma_{2,1} + \gamma_{3,1} - \gamma_{4,1} - \gamma_{5,1} - \gamma_{6,1} - \gamma_{7,1} - \gamma_{8,1} = 0$ $\delta_7 - \gamma_{2,1} - \gamma_{3,1} - \gamma_{4,1} + \gamma_{5,1} - \gamma_{6,1} - \gamma_{7,1} - \gamma_{8,1} = 0$ $\delta_8 - \gamma_{2,1} - \gamma_{3,1} - \gamma_{4,1} + \gamma_{5,1} - \gamma_{6,1} + \gamma_{7,1} + \gamma_{8,1} = 0$ As is apparent from the inverse matrix, the current value i[n,1] (n is an integer of 2 to 8) is obtained by multiplying the added and/or subtracted values of the measured currents I (which is the same as in the subsection <Data reading method—Basis>) by a correction value $\gamma_{k,1}$ (>0). The multiplication by the correction value $\gamma_{k,1}$ does not cause inversion between the positive and negative signs; thus, the correction value $\gamma_{k,1}$ can be regarded as 1 in the case of simply handling digital data. However, the correction value $\gamma_{k,1}$ cannot be ignored in the case of handling multi-level data or analog data as described later.

Whether an element of an inverse matrix is positive or negative corresponds to that in a Hadamard matrix. That is, whether an element in a k-th row and a j-th column (k is an integer of 2 to 8, and j is an integer of 1 to 8) of an inverse matrix is positive or negative is the same as whether an element in the k-th row and the j-th column of a Hadamard matrix is positive or negative.

Note that the formula to calculate the current value i[1,1] is complex. However, there is no need to obtain the current value i[1,1] of the element device 11[1,1] if the element device 11[1,1] is used only to write particular data as described in the subsections <Data reading method—Modification 1> to <Data reading method—Modification 3>.

<Multi-Level- or Analog-Data Reading Method>

If the element devices 11 can store multi-level data, the data can also be read. For example, when storing data "0", "1", "2", and "3", the element devices 11 allow the flow of currents of 0.9 µA, 1.1 µA, 1.3 µA, and 1.5 µA, respectively. Here, there is no variation among the element devices.

Note that in the following description, data is obtained by comparison between data of the element device 11[1,1] and that of each of the other element devices 11 as described in the subsection <Data reading method—Modification 2>. Here, the element device 11[1,1] constantly stores data "0".

For example, the element devices 11[1,1] to 11[8,1] store "0", "1", "3", "1", "2", "2", "3", and "0", respectively. That is, differences of the current values i[2,1] to i[8,1] from the current value i[1,1] are 0.2 µA, 0.6 µA, 0.2 µA, 0.4 µA, 0.4 µA, 0.6 µA, and 0 µA, respectively.

As described above in the subsection <Data reading method—Basis>, currents flowing through the sense line Sns[1] at times t=1 to t=8 are 9.6 µA, 0.8 µA, −0.4 µA, −1.2 µA, −0.4 µA, −0.4 µA, −0.8 µA, and 0 µA, respectively. As in the subsection <Data reading method—Basis>, the current $I[1]_{t=1}$ is set to 0. The currents $I[1]_{t=2}$ to $I[1]_{t=8}$ are obtained by AD conversion of the currents flowing through the sense line Sns[1]. An accuracy (an increment in current) of 0.2 µA is sufficient for the AD conversion, and even twice the value does not cause an error.

First, the accuracy of the AD conversion is set to 0.2 µA. The currents $I[1]_{t=2}$ to $I[1]_{t=8}$ obtained by dividing the currents flowing through the sense line Sns[1] by 0.2 µA are 4, −2, −6, −2, −2, −4, and 0, respectively. That is, the currents $I[1]_{t=1}$ to $I[1]_{t=8}$ are 0, 4, −2, −6, −2, −2, −4, and 0.

The current values i[1,1] to i[8,1] obtained by multiplying the inverse matrix of the Hadamard matrix of order 8 by the currents $I[1]_{t=1}$ to $I[1]_{t=8}$ are −1.5, −0.5, 1.5, −0.5, 0.5, 0.5, 1.5, and −1.5. Differences of the current values i[2,1] to i[8,1] from the current value i[1,1] are 1, 3, 1, 2, 2, 3, and 0, and values obtained by multiplying these differences by 0.2 µA are 0.2, 0.6, 0.2, 0.4, 0.4, 0.3, and 0. These values are the same as the current values presented above, meaning that data can be read from the current values $I[1]_{t=1}$ to $I[1]_{t=8}$ obtained by AD conversion of the currents flowing through the sense line Sns[1].

Next, the accuracy of the AD conversion is lowered to 0.4 µA. The currents $I[1]_{t=2}$ to $I[1]_{t=8}$ obtained by dividing the currents flowing through the sense line Sns[1] by 0.4 µA are 2, −1, −3, −1, −1, −2, and 0, respectively. That is, the currents $I[1]_{t=1}$ to $I[1]I[1]_{t=8}$ are 0, 2, −1, −3, −1, −1, −2, and 0.

The current values i[1,1] to i[8,1] obtained by multiplying the inverse matrix of the Hadamard matrix of order 8 by the currents $I[1]_{t=1}$ to $I[1]_{t=8}$ are −0.75, −0.25, 0.75, −0.25, 0.25, 0.25, 0.75, and −0.75. Differences of the current values i[2,1] to i[8,1] from the current value i[1,1] are 0.5, 1.5, 0.5, 1, 1, 1.5, and 0, and values obtained by multiplying these differences by 0.4 µA are 0.2, 0.6, 0.2, 0.4, 0.4, 0.3, and 0. These values are the same as the current values presented above, meaning that data can be read from the current values $I[1]_{t=1}$ to $I[1]_{t=8}$ obtained by AD conversion of the currents flowing through the sense line Sns[1].

These results are obtained because none of the differences of the currents $I[1]_{t=2}$ to $I[1]_{t=8}$ is less than 0.4 µA. For example, a current $I[1]_{t=j1}$ and a current $I[1]_{t=j2}$ (j1 and j2 are each an integer of 2 to 8, and j1≠j2) are represented by $$I[1]_{t=j1} = i[1,1] + h_{j1,2}i[2,1] + h_{j1,3}i[3,1] + \ldots + h_{j1,8}i[8,1]$$

and $$I[1]_{t=j2} = i[1,1] + h_{j2,2}i[2,1] + h_{j2,3}i[3,1] + \ldots + h_{j2,8}i[8,1].$$

Hence, $$I[1]_{t=j1} - I[1]_{t=j2} = (h_{j1,2} - h_{j2,2})i[2,1] + (h_{j1,3} - h_{j2,3})i[3,1] + \ldots + (h_{j1,8} - h_{j2,8})i[8,1].$$

In a polynomial on the right side of the equation, coefficients of the current values i[2,1] to i[8,1] are differences between elements of the Hadamard matrix. Since the elements of the Hadamard matrix are either 1 or −1, the coefficients are −2, 0, or 2. Therefore, the difference between the current $I[1]_{t=j1}$ and the current $I[1]_{t=j2}$ is two or more times the increment of the current values i[2,1] to i[8,1].

In the above example, the element devices 11 can store four-level data, and the same applies to the case of storing analog data. Here, the current value i of current flowing in the element device 11 is in the range of 0.9 µA to 1.1 µA. Specifically, the current values i[2,1] to i[8,1] are determined using a random number generating function, and these values are used to calculate currents that are output in accordance with coded signals based on the Hadamard matrix of order 8 and that flow through the sense line Sns[1]. Note that the current value i[1,1] is 0.9 µA. Single-digit figures obtained by dividing these values by 0.1 µA (i.e., the accuracy of current measurement is 0.1 µA) are the currents $I[1]_{t=2}$ to $I[1]_{t=8}$. Note that the current $I[1]_{t=1}$ is 0. Data obtained by multiplying the difference between and the current value i[1,1] and each of the current values i[2,1] to i[8,1] by 0.1 µA is read analog data.

For example, when the current values i[1,1] to i[8,1] are 0.900, 1.045, 1.065, 1.047, 1.034, 0.959, 1.004, and 0.982 (the differences (true values) of the current values i[2,1] to i[8,1] from the current value i[1,1] are 0.145, 0.165, 0.147, 0.134, 0.059, 0.104, and 0.082), digitized values of the currents $I[1]_{t=1}$ to $I[1]_{t=8}$ are 0, 0, 2, 1, 1, 2, 2, and −2. Values obtained by multiplying the differences of the current values i[2,1] to i[8,1] from the current value i[1,1], which are obtained from the digitized values of the currents I, by 0.1 µA are 0.125 µA, 0.175 µA, 0.150 µA, 0.125 µA, 0.125 µA, 0.050 µA, and 0.100 µA. A comparison between these values and the above true values shows that these values deviate from the true values by 0.008 µA on average. This corresponds to approximately 7% of the average of the true values and 8% of the resolution.

The deviation is smaller than that in the case of individually measuring currents flowing in the element devices 11[1,1] to 11[8,1]. In the case of individually measuring currents, when the accuracy of measurement is 0.1 µA, the differences of the current values i[2,1] to i[8,1] from the current value i[1,1] are 0.1 µA, 0.2 µA, 0.1 µA, 0.1 µA, 0.1 µA, 0.1 µA, and 0.1 µA, which deviate from the true values by 0.028 µA on average. This corresponds to approximately 23% of the average of the true values and 28% of the resolution.

Note that the deviation is further decreased by increasing the order of the Hadamard matrix. For example, when a similar operation is performed with a Hadamard matrix of order 256 and with 256 current values i including the above eight current values i[1,1] to i[8,1], the differences of the current values i[2,1] to i[8,1] from the current value i[1,1] deviate from the true values thereof by 0.0012 µA on average. This corresponds to approximately 1% of the average of the true values.

By such coded signals using a Hadamard matrix of order N, data can be reproduced at an accuracy higher than that of AD conversion (in the above example, 0.1 µA). Data are generally reproducible at an accuracy as high as a fraction of the square root of N of that of AD conversion. Ideally, in the case where N=8, data can be reproduced at an accuracy as high as approximately 1/2.8 of that in the case where N=1 (i.e., the case of individually measuring current values i flowing in the element devices 11). In the above example, the deviation in the case where N=8 is approximately 1/3.5 of that in the case where N=1. The deviation in the case where N=256 is approximately 1/23.

This also means that the accuracy of AD conversion may be lowered when a Hadamard matrix of higher order is used. For example, in the case where N=256, even when the resolution is 0.5 µA, data can be read at an accuracy comparable to, or higher than, that in the case where N=8 and the resolution is 0.1 µA. An actual numerical experiment conducted at an accuracy of AD conversion of 0.5 µA has shown that the average of deviations from true values is 0.004 µA. This value is smaller than the value in the above-described case where N=8 (0.008 µA). In the case where the accuracy of AD conversion is 1 µA, the accuracy of reading can be estimated to be four times that in the case where the accuracy of AD conversion is 0.5 µA. An actual numerical experiment has shown that the average of deviations from true values is 0.016 µA. This value is inferior to the value in the case where N=8 and the accuracy of AD conversion is 0.1 µA, but is superior to the value in the case where N=1 and the accuracy of AD conversion is 0.1 µA (i.e., the case of individually measuring values).

In this manner, as the scale of the Hadamard matrix increases, the accuracy of calculation can be increased and the accuracy of AD conversion can be decreased. In the above example, it has been shown that data can be reproduced within an error of several percent with respect to a true value even when AD conversion is conducted in an increment (0.5 µA) larger than the amount of change in the current value i (0.2 µA). Note that the subsection <Correction method for asymmetry> can also be applied in handling multi-level data and analog data.

<Arithmetic Circuit of Matrix Device>

In the matrix device 10, as described above, the second physical quantities can be obtained by supplying coded signals to the plurality of element devices 11 through the drive lines Drv, conducting AD conversion or the like to quantify the first physical quantity output to the sense line Sns from the element devices 11 in accordance with the coded signals, and multiplying an inverse matrix (including its corrected matrix) of the Hadamard matrix (including a similar matrix, a derived matrix, and the like) by the quantified values. The second physical quantities may be further subjected to numerical processing. Some or all of these operations may be executed using an existing arithmetic device and existing software, but can be executed using a dedicated device added to the matrix device.

Figure 4A:
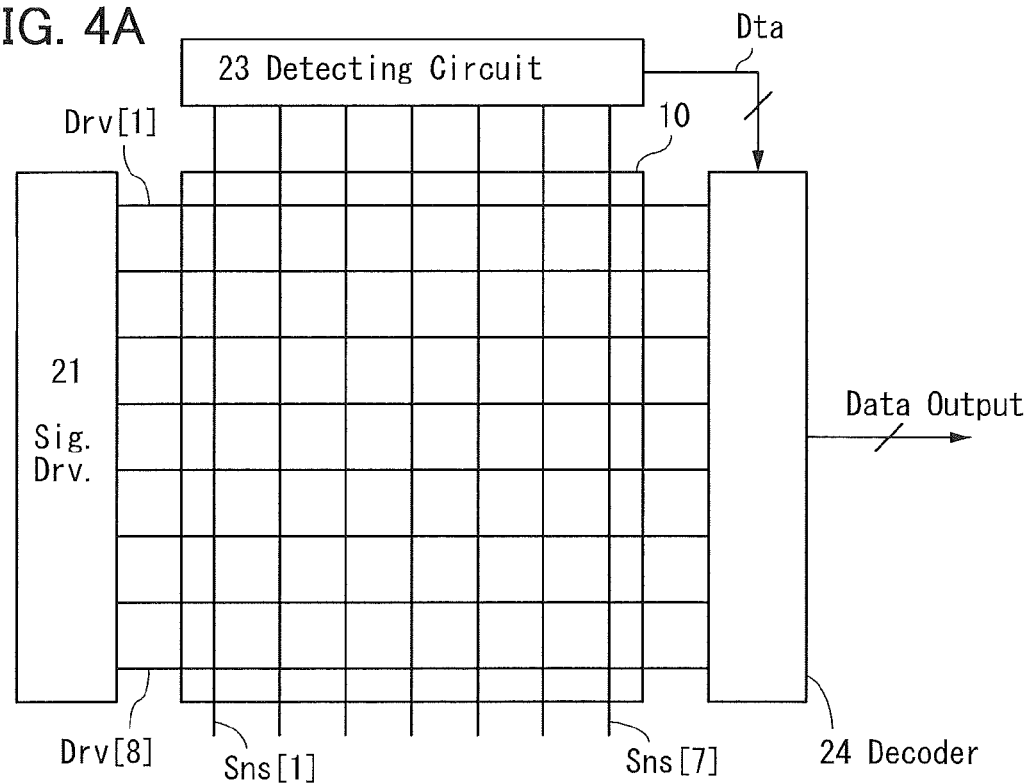
FIGS. 4A and 4B each illustrate a configuration example of an electronic device.

FIG. 4A illustrates an example of an electronic device including a peripheral circuit for driving the matrix device 10 with eight rows and seven columns Signals are applied to the drive lines Drv[1] to Drv[8] from the signal generation circuit 21. The signal generation circuit 21 can output coded signals based on the Hadamard matrix. For example, the coded signals may be stored in a ROM or the like.

A current(s) flowing through one of, some of, or all of the sense lines Sns[1] to Sns[7] is converted to a current(s) I having a digital value(s) by a detecting circuit 23. The current I is input to a decoder 24 through a data line Dta. The signals of the drive lines Drv[1] to Drv[8] are also input to the decoder 24. The current I is decoded by the decoder 24 and is then output.

Figure 4B:
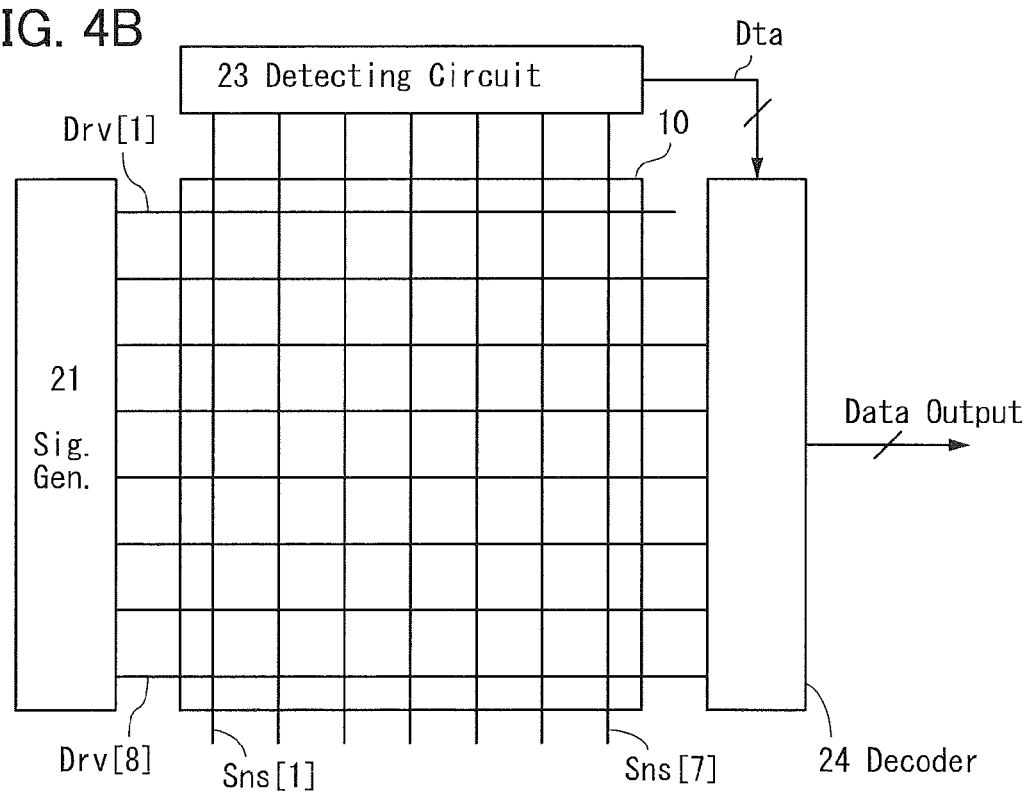

Note that in the case of employing the method described in the subsection <Data reading method—Modification 2>, since the matrix for calculating the second physical quantities is obtained by replacing −1 with 0 in a submatrix obtained by removing the first row and the first column from the Hadamard matrix, coded signals corresponding to the first row of the Hadamard matrix (the signal input to the drive line Drv[1]) is not used for the calculation. For this reason, the signal of the drive line Drv[1] is not necessarily input to the decoder 24 as in an electronic device illustrated in FIG. 4B.

FIG. 5 illustrates configurations of the detecting circuit 23 and the decoder 24 in the case of inputting a signal from the signal generation circuit 21 via the demultiplexer 22 to the matrix device 10 as illustrated in FIG. 3B. A current from the matrix device 10 is input to the detecting circuit 23 and converted to a current I having a digital value. The current I is input to the decoder 24 through the data line Dta. In addition, the signals from the signal generation circuit 21 are input to the decoder 24 through a delay circuit 25. Note that the delay circuit 25 is not necessarily provided. In the case of employing the method described in the subsection <Data reading method—Modification 2>, a signal output from the signal generation circuit 21 to a terminal Trm[1] is not necessarily input to the decoder 24.

In this manner, the signals of the signal generation circuit 21 (or the signals of the drive lines Drv[1] to Drv[8]) can be used for decoding. In the case of calculating the second physical quantities by decoding the first physical quantity (such as a current) that is output in accordance with the coded signals of the Hadamard matrix, the inverse matrix of the Hadamard matrix is used. Since the inverse matrix has the same structure as the original matrix, operations can be simplified. This will be described below. Note that the following description applies to not only the Hadamard matrix but also all matrices whose inverse matrices are multiples thereof For example, signals applied to the drive line Drv[n] (n is an integer of 1 to 8) are $h_{1,n}$ at time t=1, $h_{2,n}$ at time t=2, $h_{3,n}$ at time t=3, ..., $h_{8,n}$ at time t=8.

Currents flowing through the sense line Sns[m] (in is an integer of 1 to 7) are $I[m]_{t=1}$ at time t=1, $I[m]_{t=2}$ at time t=2, $I[m]_{t=3}$ at time t=3, ..., $I[m]_{t=8}$ at time t=8.

A formula for calculating a current value i[n,m] using the currents $I[m]_{t=1}$ to $I[m]_{t=8}$ is represented by $$i[n, m] = \frac{1}{8}(h_{1,n}I[m]_{t=1} + h_{2,n}I[m]_{t=2} + h_{3,n}I[n]_{t=3} + \ldots + h_{8,n}I[m]_{t=8}).$$

For a relative comparison between the element devices 11, ⅛ may be regarded as 1. Hence, $$i[n,m]=h_{1,n}I[m]_{t=1}+i[n,m]=h_{2,n}I[m]_{t=2}+i[n,m]=h_{3,n}I[m]_{t=3}+\ldots+i[n,m]=h_{8,n}I[m]_{t=8}.$$

Since $h_{1,n}, h_{2,n}, h_{3,n}, \ldots, h_{8,n}$ are either 1 or −1, this formula means sequentially adding and/or subtracting the currents $I[m]_{t=1}$ to $I[m]_{t=8}$ based on $h_{1,n}, h_{2,n}, h_{3,n}, \ldots h_{8,n}$. That is, when $h_{k,n}$ (k is an integer of 1 to 8) is 1, addition is performed, and when it is −1, subtraction is performed. Alternatively, when $h_{k,n}$ is 1, a value is added as it is, and when it is −1, a value with an inverted sign is added. In the formula, the order where $h_{1,n}, h_{2,n}, h_{3,n}, \ldots, h_{8,n}$ appear is the same as the order of coded signals applied to the drive line Drv[n].

In the case where the currents $I[m]_{t=1}$ to $I[m]_{t=8}$ are either of two digital values (i.e., either 1 or −1), addition is performed when $h_{k,n}$ (k is an integer of 1 to 8) is 1, and no operation needs to be performed when it is −1. This is because this operation is the same as an operation of subtracting 8 from the result of an operation of adding 2 when $h_{k,n}$ is 1 and performing no operation when it is −1.

Here, assuming that the current $I[m]_{t=1}$ is obtained when the signal of the drive line Drv[n] is $h_{1,n}$, the first term ($h_{1,n}I[m]_{t=1}$) of the above formula can be determined using $h_{1,n}$. The first term is stored by some means. Since $h_{1,n}$ is 1 in the Hadamard matrix created by Sylvester's method, the current $I[m]_{t=1}$ may be stored. Note that the current $I[m]_{t=1}$ may be constantly 0 as described above.

Next, assuming that the current $I[m]_{t=2}$ is obtained when the signal of the drive line Drv[n] is $h_{2,n}$, an operation of either adding the current $I[m]_{t=2}$ to the stored first term (when $h_{2,n}$ is 1) or subtracting the current $I[m]_{t=2}$ therefrom (when $h_{2,n}$ is −1) is executed in accordance with $h_{2,n}$. By this stage, the sum of the first and second terms of the above formula is obtained. The result is stored. The previously stored first term may be overwritten because it is not used after this.

Next, assuming that the current $I[m]_{t=3}$ is obtained when the drive line Drv[n] is $h_{3,n}$, an operation of either adding the current $I[m]_{t=3}$ to the stored result of the first term and/or the second term or subtracting the current $I[m]_{t=3}$ therefrom is executed in accordance with $h_{3,n}$. At this stage, the sum of the first to third terms of the above formula is obtained. The result is stored. After that, the operation of adding or subtracting a current I[m] to or from the stored results and then storing the result is similarly repeated, whereby the above formula can be obtained.

Whether the current I[m] is added or subtracted is determined using the signal of the drive line Drv[n] in the above-described example of operation. In the case where there is a delay in outputting the current I[m], the same operation can be performed using a signal obtained by delaying the signal of the drive line Drv[n] with a delay circuit or the like in accordance with the delay. Since operations are successively performed as described above, the required storage capacity can be reduced and the processing speed can be increased.

Figure 6B:
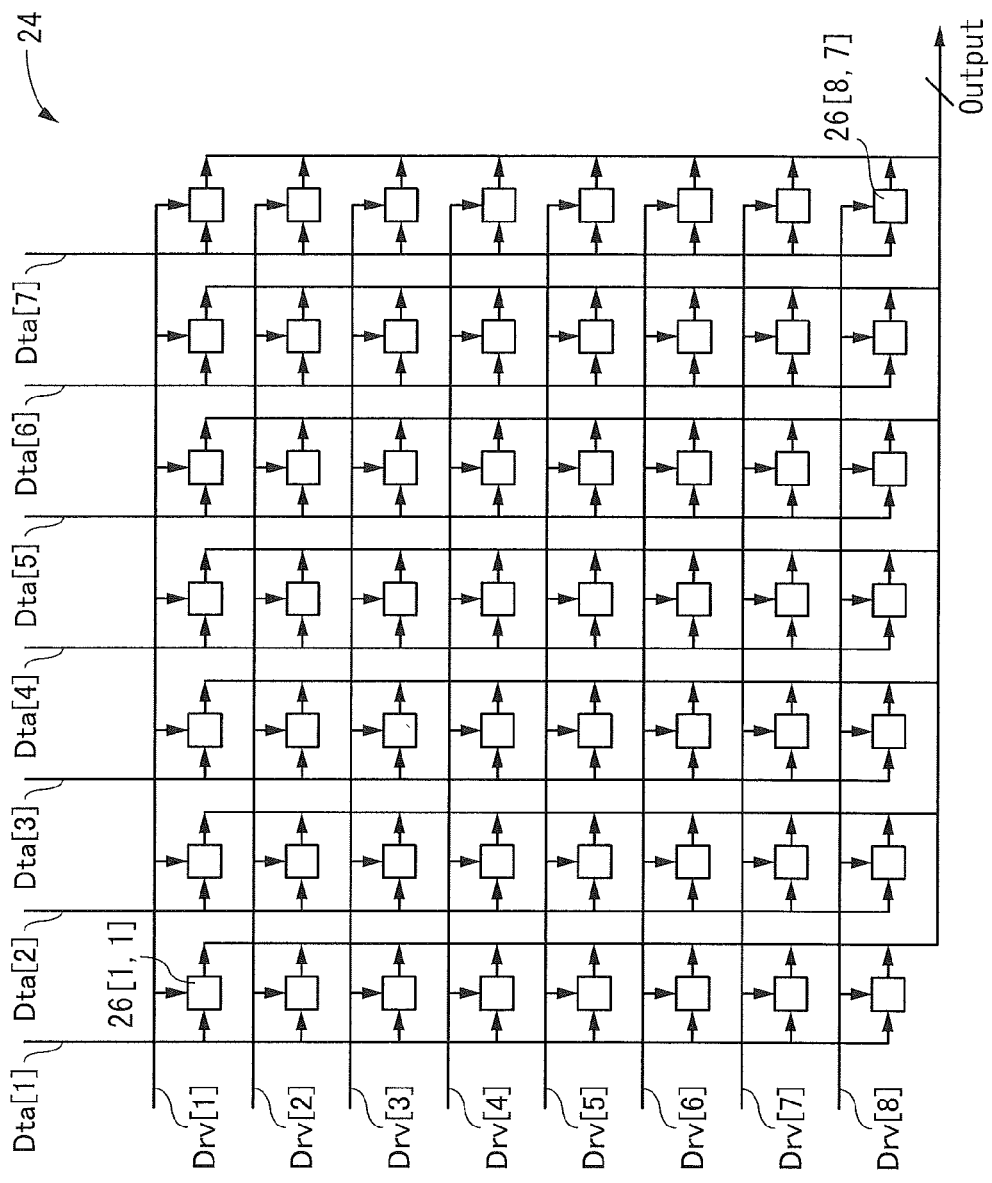
FIGS. 6A and 6B each illustrate a configuration example of a decoder.
Figure 6A:
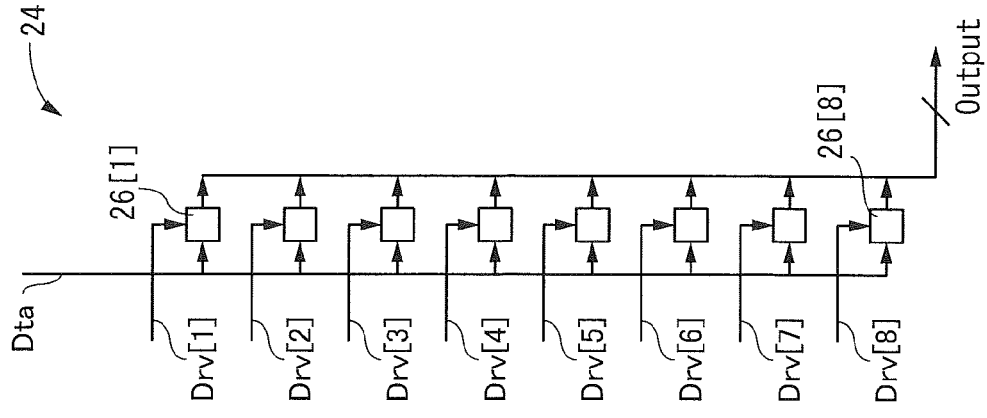

FIG. 6A illustrates an example of the decoder 24. The decoder 24 includes arithmetic circuits 26[1] to 26[8], and the current I (a digital value) output from the detecting circuit 23 is input to the arithmetic circuits 26[1] to 26[8] through the data line Dta. In addition, each of the arithmetic circuits 26[1] to 26[8] receives a signal of the corresponding one of the drive lines Drv[1] to Drv[8]. Note that the arithmetic circuit 26[1] is not necessarily provided in the case of employing the method described in the subsection <Data reading method—Modification 2>.

FIG. 6B illustrates an example of the decoder 24 capable of simultaneously decoding all the current values i of the 56 element devices 11 in the matrix device 10 with eight rows and seven columns. That is, seven currents I[1] to I[7] can be simultaneously input to the decoder 24 through data lines Dta[1] to Dta[7]. The decoder 24 includes 56 arithmetic circuits 26[1,1] to 26[8,7], each of which receives a signal of the corresponding one of the drive lines Drv[1] to Drv[8].

Figure 7A:
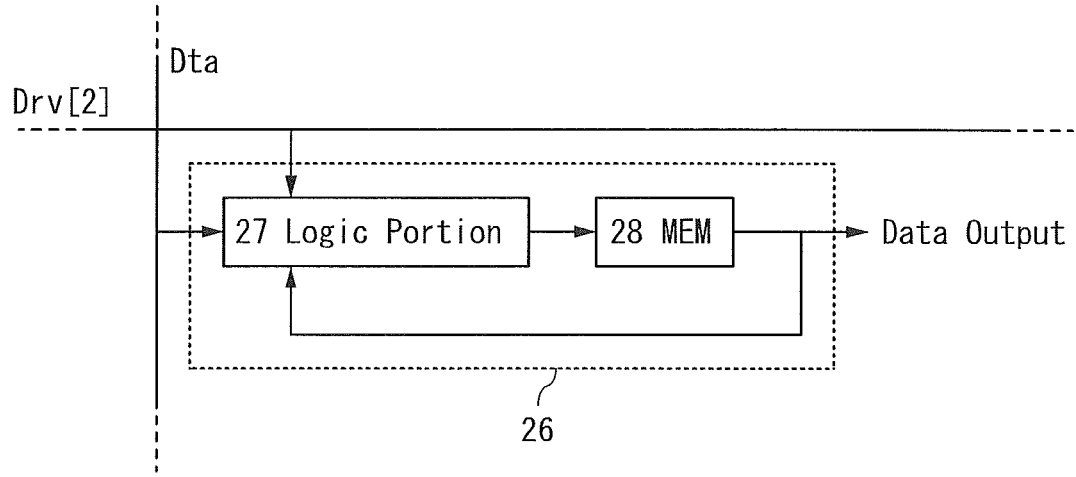
FIGS. 7A and 7B illustrate a configuration example and an operation example of an arithmetic circuit.

FIG. 7A illustrates a basic configuration example of the arithmetic circuit 26. The arithmetic circuit 26 includes a logic portion 27 and a memory 28. The current I (a digital value) is input to the logic portion 27 through the data line Dta. In addition, the signal of the data line Drv (in FIG. 7A, the drive line Drv[2]) is input to the logic portion 27. Furthermore, data stored in the memory 28 is input to the logic portion 27. The logic portion 27 performs an operation based on these inputs, and the memory 28 stores the operation result. The operation result can be output to the outside.

Figure 7B:
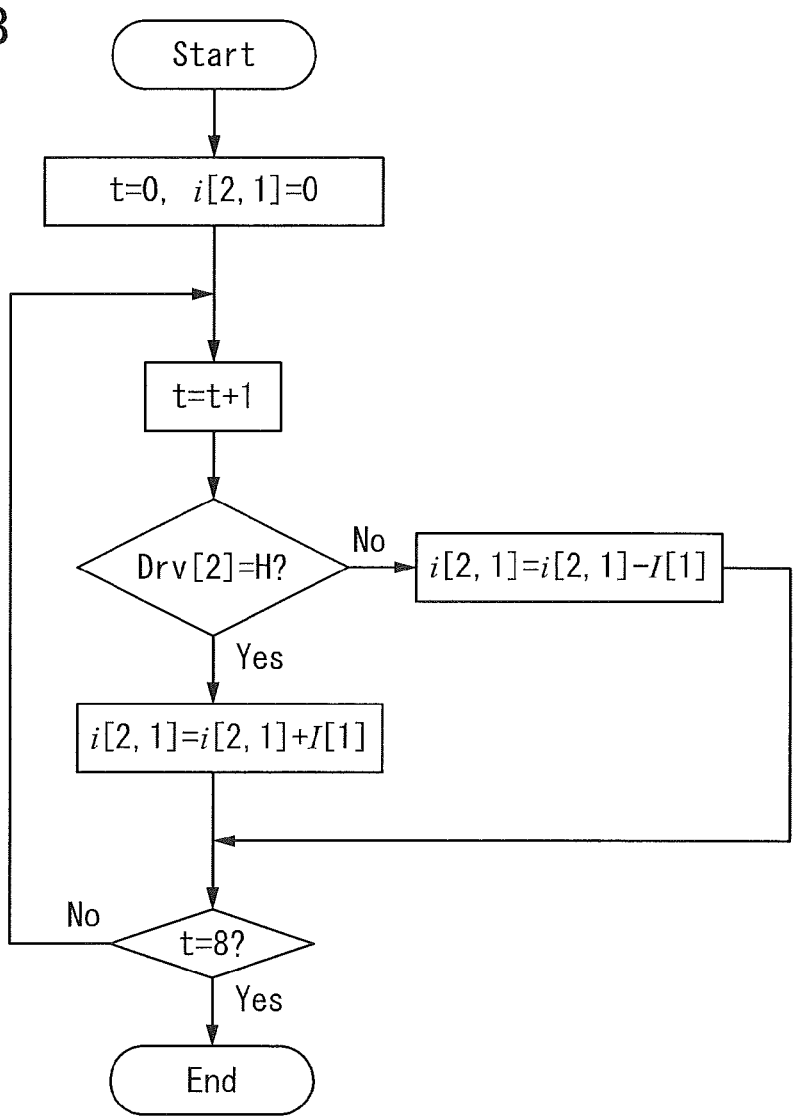

An example of the operation process will be described with reference to a flowchart in FIG. 7B. Here, the current value i[2,1] will be obtained. Initially (at t=0), the current value i[2,1] is 0. First, t is increased by 1. Next, whether the signal of the drive line Drv[2] at that time is H (i.e., 1) or L (i.e., −1) is determined. When the signal is H, the current value i[2,1] is a value obtained by adding the current I to the most recent current value i[2,1] (that is stored in the memory 28). When the signal is L, the current value i[2,1] is a value obtained by subtracting the current I from the most recent current value i[2,1].

Note that in the case of employing the method described in the subsection <Data reading method—Modification 2>, the same applies when the signal is H, but the current value i[2,1] is not subjected to the subtraction when the signal is L. This is because the corresponding element in the matrix $H_A$ is 0.

The arithmetic circuit 26 illustrated in FIG. 7A can be utilized not only in the case where the current value i (or the corresponding data) is binary data but also in the case where it is multi-level data or analog data. When the current value i corresponds to binary or three-level data, an operation can be more easily executed using an arithmetic circuit 26 illustrated in FIG. 8A.

Figure 8A:
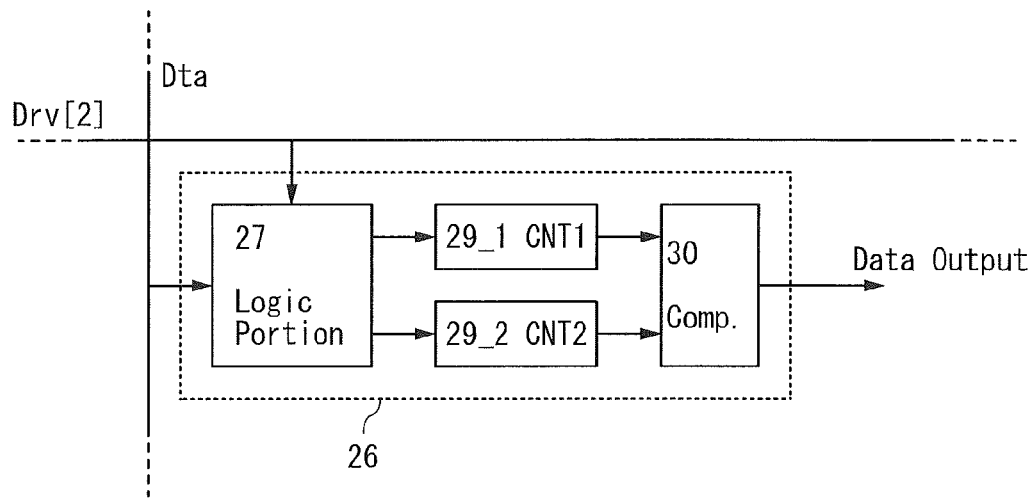
FIGS. 8A and 8B illustrate configuration examples of an arithmetic circuit and a logic portion.

The arithmetic circuit 26 illustrated in FIG. 8A includes the logic portion 27, a first counter 29_1, a second counter 29_2, and a comparator 30. The signal of the drive line Drv[2] and the signal of the data line Dta (the current I, a digital value) are input to the logic portion 27. Outputs of the logic portion 27 are input to the first counter 29_1 and the second counter 29_2. The comparator 30 has a function of comparing outputs of the first counter 29_1 and the second counter 29_2.

The first counter 29_1 and the second counter 29_2 have a function of counting the number of input signals (either H or L). The first counter 29_1 and the second counter 29_2 may each be an 8-bit memory because the logic portion 27 outputs an H or L signal eight times as described below.

The logic portion 27 calculates the product of the signal of the drive line Drv[2] and the signal of the data line Dta at that time. Signals are applied to the drive line Drv[2] at eight times t=1 to t=8. The currents I based on the signals (each value corresponding to −1, 0, or 1 in the method described in the subsection <Data reading method—Basis> or each value corresponding to −1 or 1 in the method described in the subsection <Data reading method—Modification 3>) are supplied to the logic portion 27 through the data line Dta. Outputs (H or L) of the logic portion 27 at each time are input to the first counter 29_1 and the second counter 29_2.

After time t=8, the comparator 30 counts and compares the numbers of signals output from the first counter 29_1 and the second counter 29_2 and outputs the result. For example, the comparator 30 outputs 1 when the number of either H or L signals output from the first counter 29_1 is larger than that output from the second counter 29_2, otherwise it outputs 0. This data corresponds to the current value i.

Figure 8B:
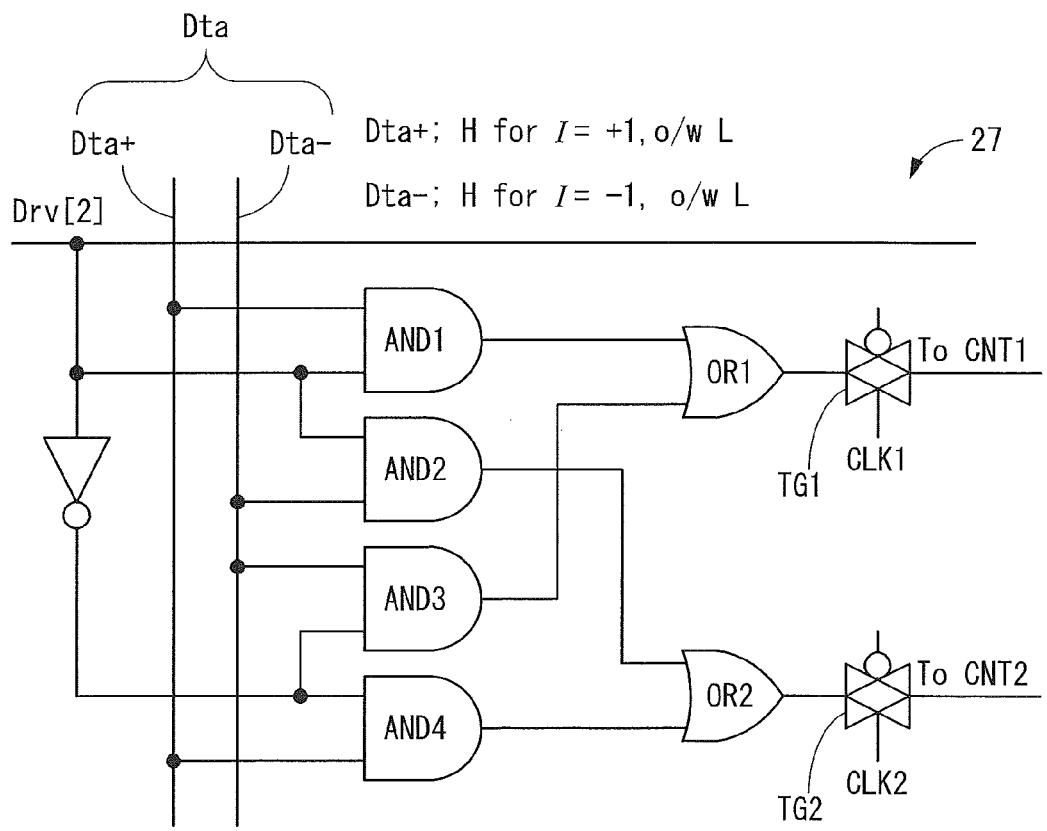

FIG. 8B illustrates an example of the logic portion 27 which can be employed for the method described in the subsection <Data reading method—Basis>. Here, the data line Dta for inputting signals to the logic portion 27 includes a data line Dta+ and a data line Dta−. The detecting circuit 23 digitizes a current flowing through the sense line Sns and outputs any of three values of 1, 0, and −1 as described in the subsection <Data reading method—Basis>. Accordingly, the detecting circuit 23 outputs H to the data line Dta+ when the current I is 1 and outputs L to the data line Dta+ when the current I is 0 or −1. Similarly, the detecting circuit 23 outputs H to the data line Dta− when the current I is −1 and outputs L to the data line Dta− when the current I is 0 or 1.

The logic portion 27 illustrated in FIG. 8B includes AND gates AND1 to AND4 which correspond to four combinations of the data line Dta+ or the data line Dta− with the drive line Drv[2] or its inverted signal. That is, when both the data line Dta+ and the drive line Drv[2] are H, only the AND gate AND1 outputs H and the others output L. When the data line Dta− is H and the drive line Drv[2] is H, only the AND gate AND2 outputs H. When the data line Dta− is H and the drive line Drv[2] is L, only the AND gate AND3 outputs H and the others output L. When the data line Dta+ is H and the drive line Drv[2] is L, only the AND gate AND4 outputs H and the others output L.

Outputs of the AND gates AND1 and AND3 are input to an OR gate OR1. An output of the OR gate OR1 is input to the first counter 29_1 through a transfer gate TG1 (synchronous with a clock signal CLK1). Outputs of the AND gates AND2 and AND4 are input to an OR gate OR2. An output of the OR gate OR2 is input to the second counter 29_2 through a transfer gate TG2 (synchronous with a clock signal CLK2). Note that the clock signal CLK1 and the clock signal CLK2 may be the same signal.

Note that an AND gate generally has an inverted output of a NAND gate, and an OR gate has an inverted output of a NOR gate. Thus, as illustrated in FIG. 9A, a modification can be made by replacing the AND gates AND1 to AND4 with NAND gates NAND1 to NAND4 and the OR gates OR1 and OR2 with NOR gates NOR1 and NOR2.

In general CMOS logic, each of AND and OR gates requires six transistors, whereas each of NAND and NOR gates requires only four transistors and are advantageous in terms of integration. The present invention is not limited thereto, and the logic portion 27 can be modified by setting signals of the data line Dta+, the data line Dta−, and the drive line Drv[2] and data counted by the first counter 29_1 and the second counter 29_2 as appropriate.

Figure 9A:
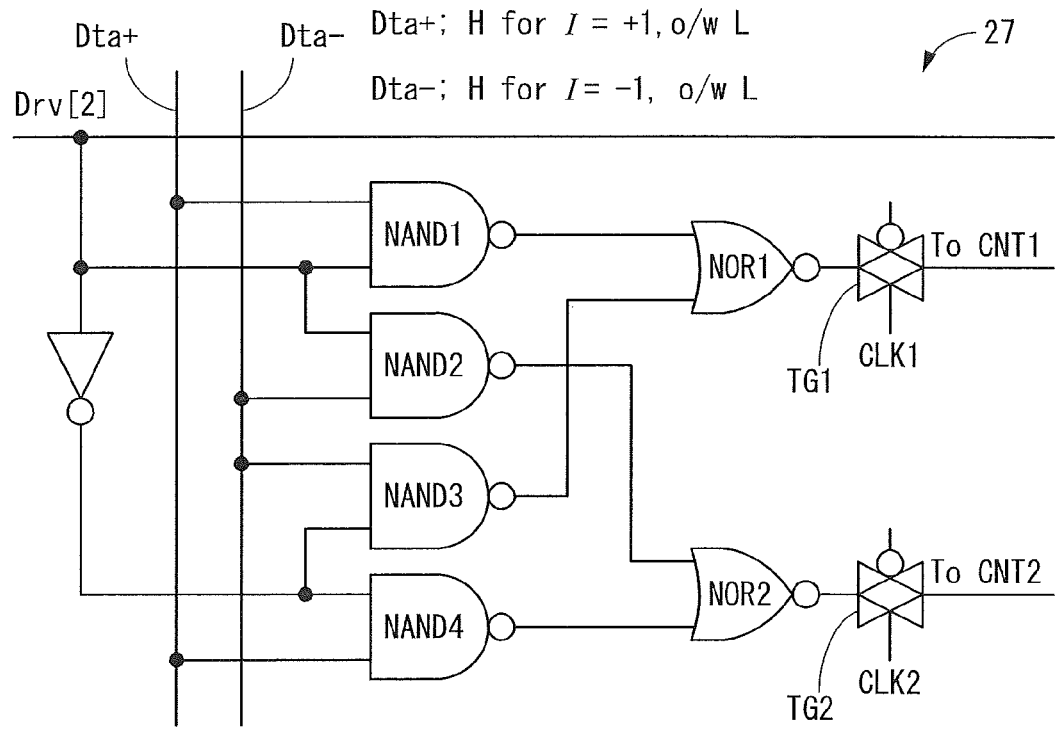
FIGS. 9A and 9B each illustrate a configuration example of a logic portion.
Figure 9B:
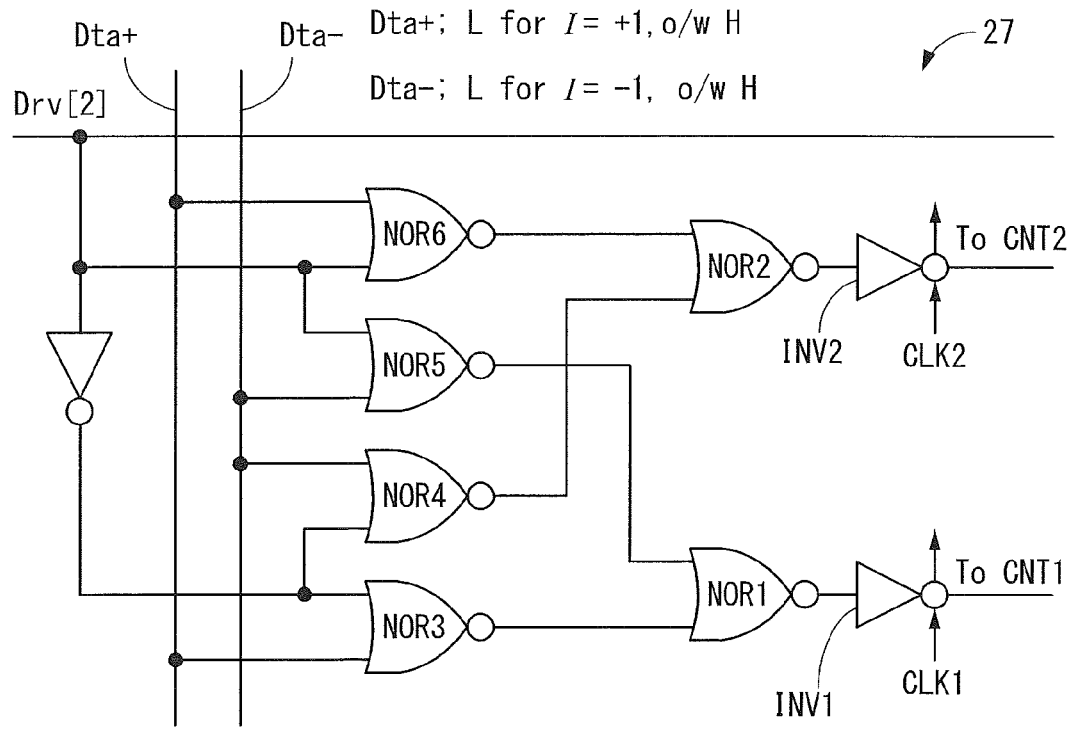

For example, NOR gates NOR3 to NOR6 may be used as illustrated in FIG. 9B in the case where the detecting circuit 23 outputs L to the data line Dta+ when the current I is 1, outputs H to the data line Dta+ when the current I is 0 or −1, outputs L to the data line Dta− when the current I is −1, and outputs H to the data line Dta− when the current I is 0 or 1.

In FIG. 9B, outputs of the NOR gates NOR1 and NOR2 are output after being inverted by inverters INV1 and INV2 which are synchronous with the clock signals CLK1 and CLK2, respectively, but may be output through transfer gates as illustrated in FIG. 9A.

Note that a circuit is simpler in the case of using the method described in the subsection <Data reading method—Modification 2>. Since elements of the matrix $H_A$ are either 1 or 0 in this method, each of the numbers of Hs and Ls for the current I with the signal of the drive line Drv being H may be counted. That is, the value of the current I with the signal of the drive line Drv being L may be ignored.

Figure 10A:
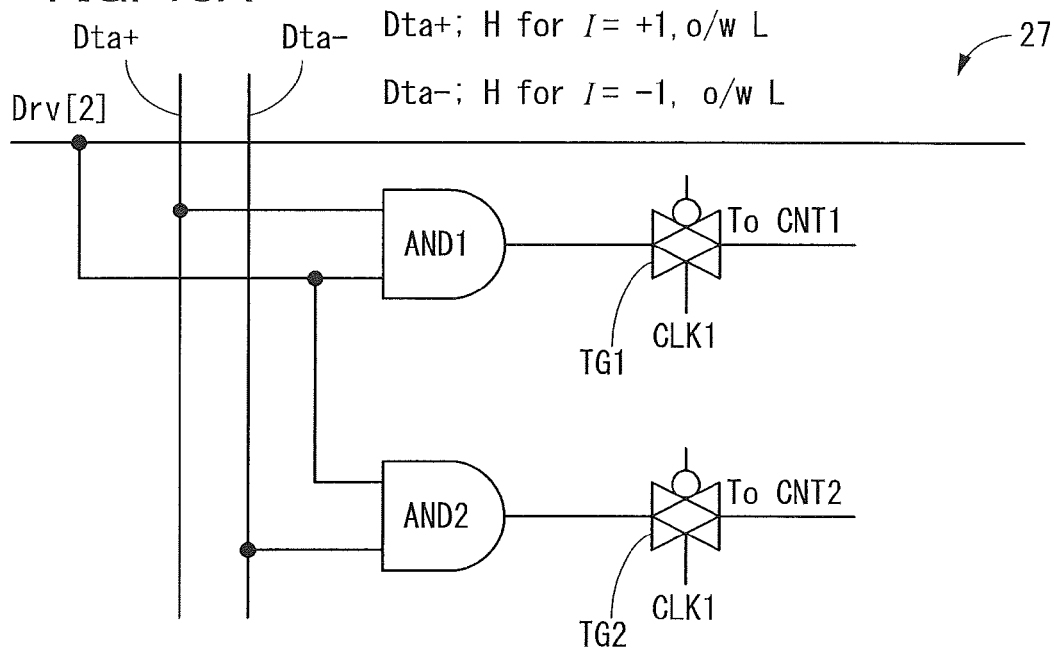
FIGS. 10A and 10B each illustrate a configuration example of a logic portion.

FIG. 10A illustrates a circuit example of the logic portion 27 which can be employed for this method. Here, the AND gate AND1 outputs H when both the drive line Drv[2] and the data line Dta+ are H. The AND gate AND2 outputs H when both the drive line Drv[2] and the data line Dta− are H. Therefore, the output of the AND gate AND1 is output to the first counter 29_1, and the output of the AND gate AND2 is output to the second counter 29_2.

Figure 10B:
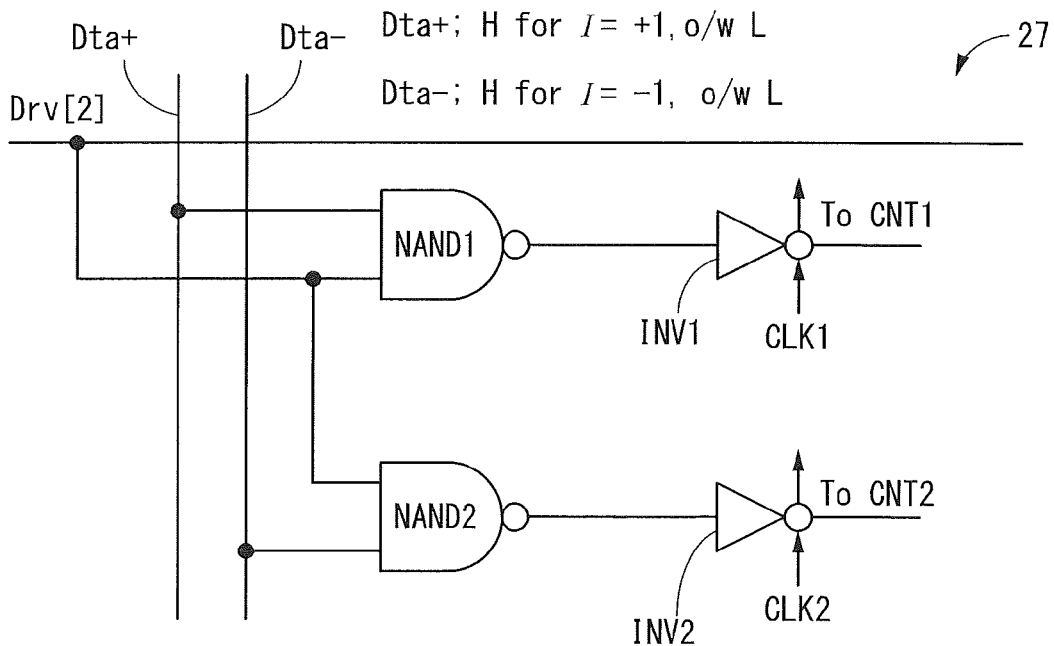

FIG. 10B is a modification of FIG. 10A, which is made by replacing the AND gate AND1, the AND gate AND2, the transfer gate TG1, and the transfer gate TG2 with the NAND gate NAND1, the NAND gate NAND2, the inverter INV1, and the inverter INV2, respectively.

The arithmetic circuit 26, the logic portion 27, and the like illustrated in FIGS. 8A to 10B can be employed for the method described in the subsection <Data reading method—Modification 3>. However, since the current I is either 1 or −1 in the method described in the subsection <Data reading method—Modification 3>, the arithmetic circuit 26, the logic portion 27, and the like having simpler circuit configurations may be used.

Figure 11A:
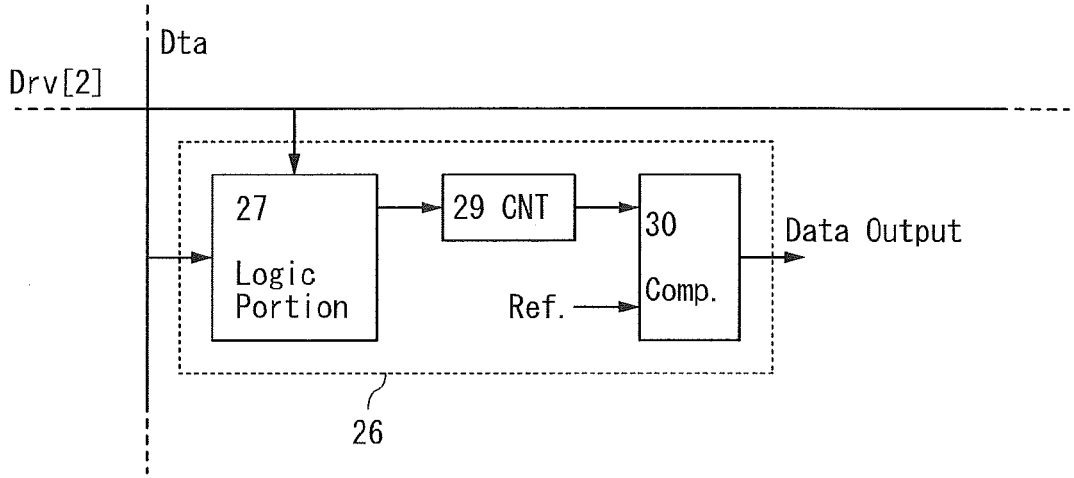
FIGS. 11A to 11D illustrate configuration examples of an arithmetic circuit and logic portions.

FIG. 11A illustrates a configuration of the arithmetic circuit 26 which can be used for the method described in the subsection <Data reading method—Modification 3>. The arithmetic circuit 26 illustrated in FIG. 11A includes the logic portion 27, the counter 29, and the comparator 30. The signal of the drive line Drv[2] and the signal of the data line Dta (the current I) are input to the logic portion 27. An output of the logic portion 27 is counted by the counter 29. An output of the counter 29 is compared with a reference value by the comparator 30.

The logic portion 27 calculates the product of the signal of the drive line Drv[2] and the signal of the data line Dta at that time. That is, when the signal of the drive line Drv[2] is the same as the signal of the data line Dta, one of H and L signals is transmitted to the counter 29. When the signal of the drive line Drv[2] is different from the signal of the data line Dta, the other of the H and L signals is transmitted to the counter 29. Such an operation can be executed using an XOR gate.

In another method, when the signal of the drive line Drv[2] is the same as the signal of the data line Dta, one of H and L signals is transmitted to the counter 29, otherwise no signal is transmitted to the counter 29. In still another method, when the signal of the drive line Drv[2] is different from the signal of the data line Dta, one of H and L signals is transmitted to the counter 29, otherwise no signal is transmitted to the counter 29.

A signal is applied to the drive line Drv[2] at eight times t=1 to t=8. The current I based on the signal is supplied to the logic portion 27 through the data line Dta. An output of the logic portion 27 at each time is input to the counter 29. The counter 29 counts the number of either H or L signals.

After time t=8, the comparator 30 compares the number of either H or L signals output from the counter 29 with the reference value. For example, the comparator 30 outputs 1 when the number of either H or L signals stored in the counter 29 is 5 or more, otherwise it outputs 0. This data corresponds to the current value i.

Figure 11B:
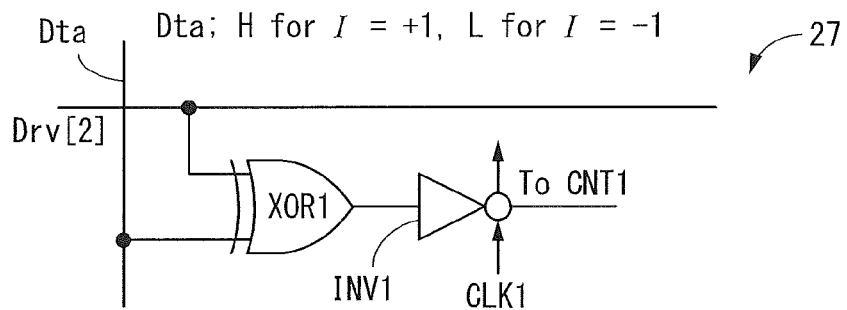

FIG. 11B illustrates an example of the logic portion 27. The detecting circuit 23 outputs one of two values of 1 and −1 as described in the subsection <Data reading method—Modification 3> when digitizing a current flowing through the sense line Sns. Accordingly, the detecting circuit 23 outputs H to the data line Dta when the current I is 1 and outputs L to the data line Dta when the current I is −1.

The logic portion 27 illustrated in FIG. 11B includes an XOR gate XOR1. The XOR gate XOR1 outputs L when both the data line Dta and the drive line Drv[2] are H or L, otherwise it outputs H. An output of the XOR gate XOR1 is output after being inverted by the inverter INV1 which is synchronous with the clock signal CLK1.

Figure 11C:
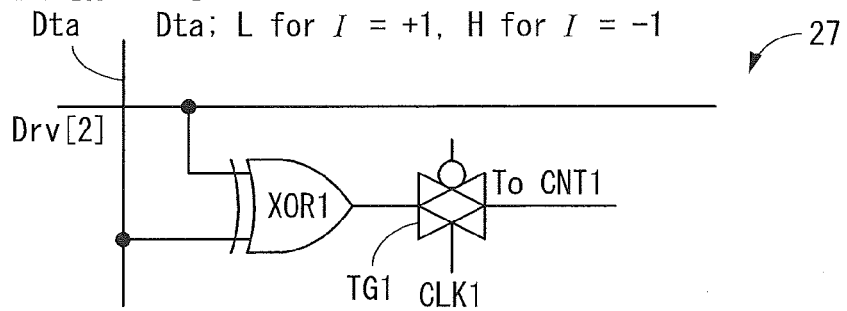

The logic portion 27 is not limited to the one illustrated in FIG. 11B, and the logic portion 27 can be modified by setting signals of the data line Dta and the drive line Drv[2] and data counted by the counter 29 as appropriate. For example, as illustrated in FIG. 11C, when the detecting circuit 23 digitizes a current flowing through the sense line Sns, L may be output to the data line Dta in the case where the current I is 1 and H may be output to the data line Dta in the case where the current I is −1. In that case, the output of the XOR gate XOR1 is output to the counter 29 through the transfer gate TG1 which is synchronous with the clock signal CLK1.

Figure 11D:
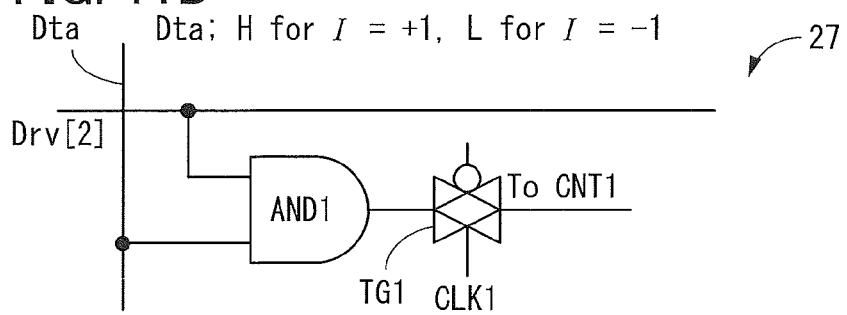

Note that a circuit is simpler in the case of employing the method described in the subsection <Data reading method—Modification 2>. Since elements of the matrix $H_A$ are either 1 or 0 in this method, only the number of Hs for the current I with the signal of the drive line Drv being H may be counted. Thus, as illustrated in FIG. 11D, the signal of the drive line Drv[2] and the signal (a digital value) of the data line Dta are input to the AND gate AND1, and its output is counted by the first counter 29_1 through the transfer gate TG1.

Note that this circuit is obtained by removing a portion relating to the AND gate AND2 from the logic portion illustrated in FIG. 10A. Thus, a modification can be made by replacing the AND gate with a NAND gate and the transfer gate with an inverter as illustrated in FIG. 10B.

Although a memory cell is given above as an example of the element device 11, the present invention is not limited thereto. For example, a photoresistor whose resistance changes with electromagnetic waves (such as visible light) may be used as the element device 11. In the case where a plurality of photoresistors are irradiated with spatially inhomogeneous electromagnetic waves, the resistances of the photoresistors vary with the intensity of the electromagnetic waves in the corresponding portion. Therefore, currents with different values flow in the photoresistors. Thus, the resistances of the photoresistors can be calculated by the above-described method. Accordingly, the distribution of the intensity of electromagnetic waves, i.e., an image, can be obtained.

Besides, the above method can be applied to, for example, measurement of characteristics of pixels (e.g., saturation current values of transistors used) in a display device or an image detecting device (an image sensor).

Embodiment 2

Figure 12:
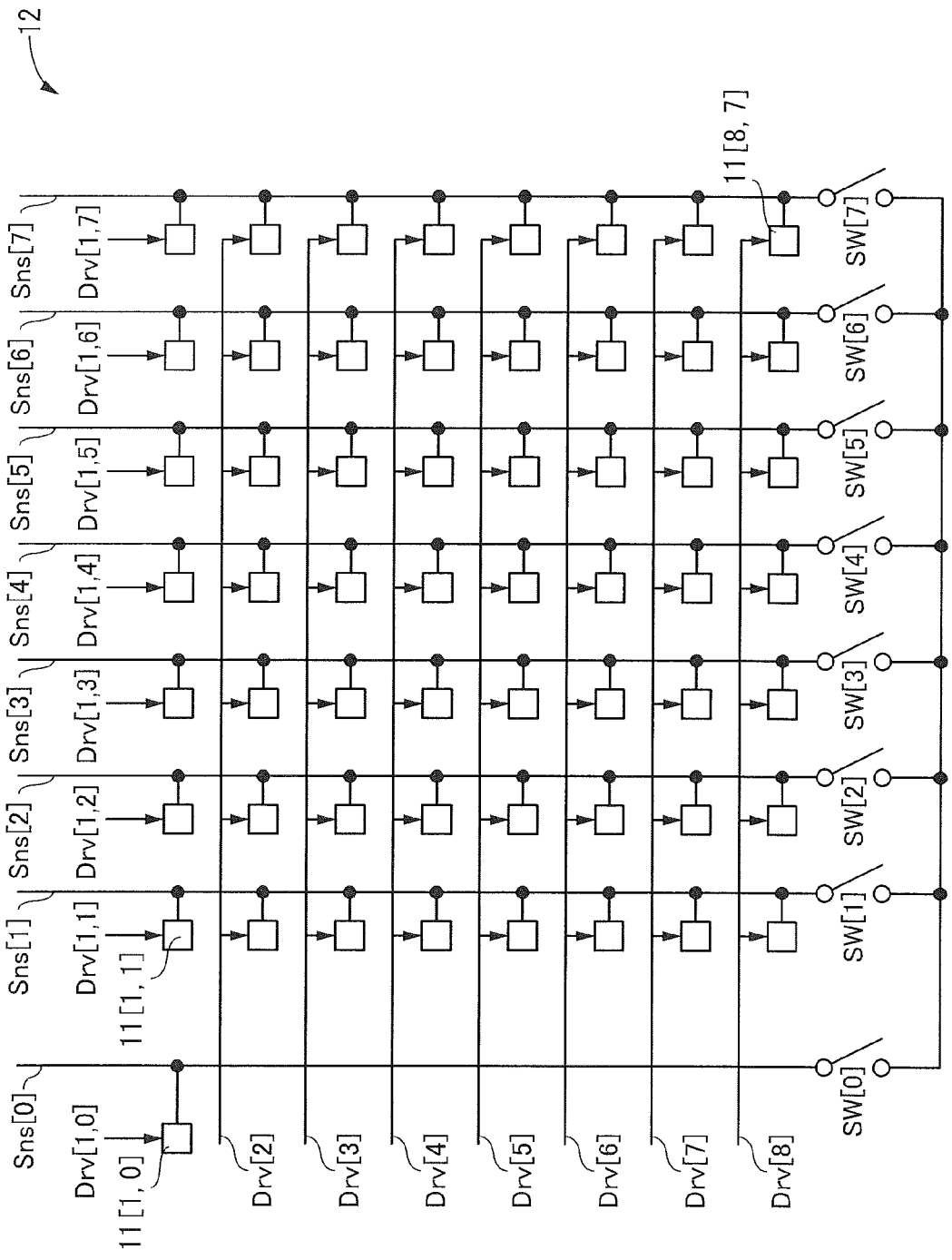
FIG. 12 illustrates a configuration example of a matrix device.

By the method described in the subsection <Data reading method—Modification 2> or <Multi-level- or analog-data reading method> in Embodiment 1, relative values can be calculated using one of the element devices 11 connected to the same sense line Sns as a reference. However, because of that, one element device 11 for each sense line Sns cannot store data (i.e., cannot be used by a user). FIG. 12 illustrates an example of a matrix device which overcomes this disadvantage.

A matrix device 12 illustrated in FIG. 12 includes a total of 56 element devices 11 arranged in eight rows and seven columns (element devices 11[1,1] to 11[8,7]) and an element device 11[1,0] serving as a reference.

The element devices 11 in the first row (the element devices 11[1,0] to 11[1,7]) change first physical quantities (for example, the current I) of sense lines Sns[0] to Sns[7] in accordance with signals of drive lines Drv[1,0] to Drv[1,7], respectively.

The element devices 11 in the second to eighth rows (the element devices 11[2,1] to 11[8,7]) change first physical quantities (for example, the current I) of the sense lines Sns[1] to Sns[7] in accordance with signals of drive lines Drv[2] to Drv[8], respectively.

The sense lines Sns[0] to Sns[7] can be separately put in a state of being electrically insulated from electric elements other than the element devices 11 connected to the respective wirings and from other wirings (i.e., a floating state). The sense lines Sns[0] to Sns[7] can be connected to each other when switches SW[0] to SW[7] are turned on. An example of a method of operation will be described below.

In a state where the switches SW[0] to SW[7] are off, second physical quantities of the element devices 11[1,1] to 11[8,7] are calculated by a method similar to the method described in the subsection <Data reading method—Modification 2> or <Multi-level- or analog-data reading method>.

At that time, signals corresponding to the first row of a Hadamard matrix are applied to the drive lines Drv[1,1] to Drv[1,7]. Signals corresponding to the second to eighth rows of the Hadamard matrix are applied to the drive lines Drv[2] to Drv[8], respectively.

As a result, a difference between the second physical quantity of the element device 11[n,m] (n is an integer of 2 to 8, and m is an integer of 1 to 7) and the second physical quantity of the element device 11[1,m] is obtained.

Next, a difference between the second physical quantity of the element device 11[1,m] and the second physical quantity of the element device 11[1,0] is obtained by applying the signals corresponding to the first to eighth rows of the Hadamard matrix to the drive lines Drv[1,0] to Drv[1,7], respectively, in a state where the switches SW[0] to SW[7] are on.

Then, a first physical quantity of any of the sense lines Sns[0] to Sns[7] at each time is measured. The thus measured physical quantity is used to obtain the difference between the second physical quantity of the element device 11[1,m] and the second physical quantity of the element device 11[1,0]. When the second physical quantity of the element device 11[1,0] is known, the second physical quantity of the element device 11[1,m] can be found, and furthermore, the second physical quantity of the element device 11[n,m] can be found.

Figure 13A:
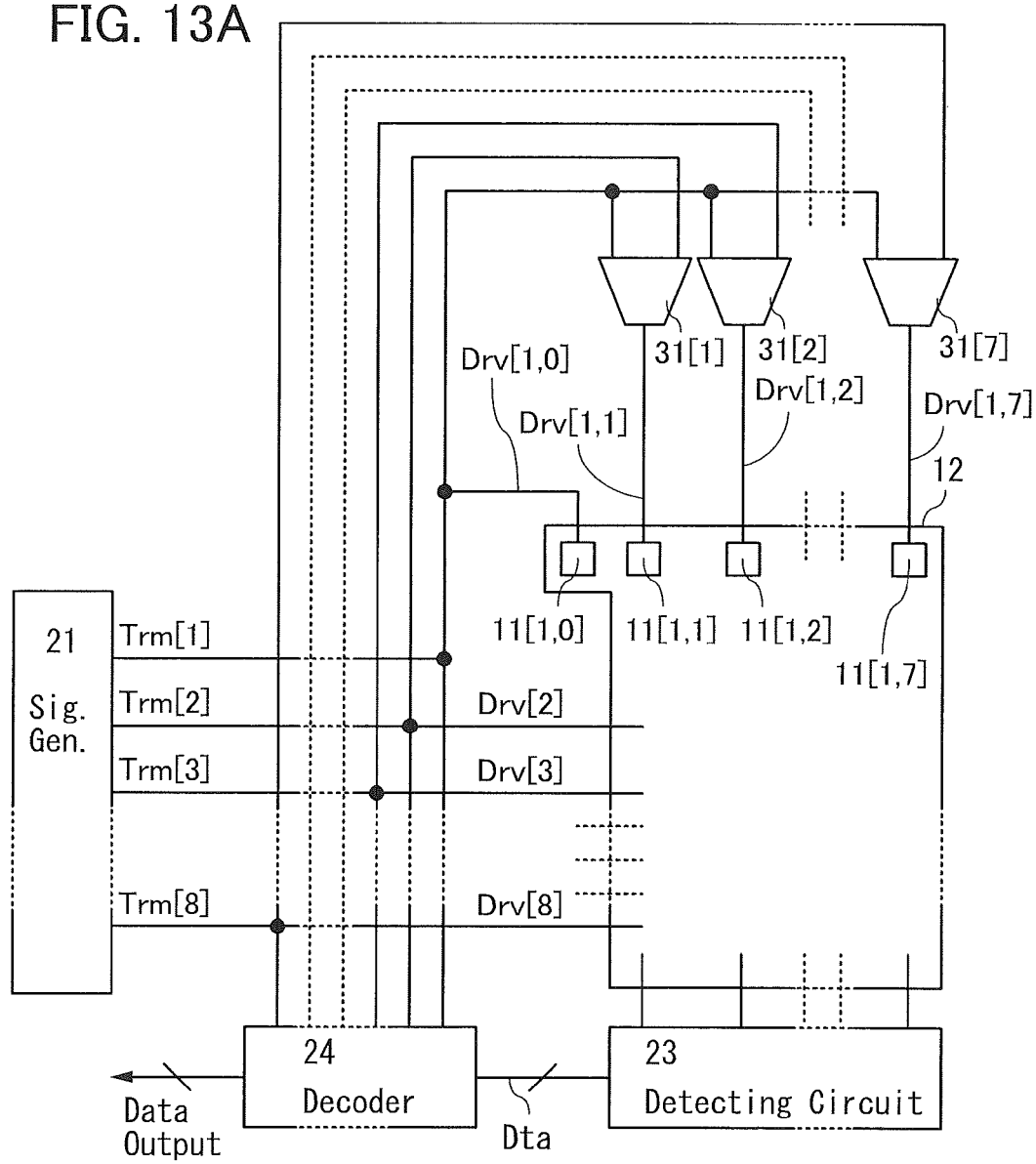
FIGS. 13A and 13B each illustrate a configuration example of an electronic device.

FIG. 13A illustrates an example of an electronic device including a peripheral circuit for driving the matrix device 12. In FIG. 13A, the signal generation circuit 21 outputs signals based on a Hadamard matrix from eight terminals Trm[1] to Trm[8]. Here, signals based on the elements in the first to eighth rows of a Hadamard matrix of order 8 are output from the terminals Trm[1] to Trm[8], respectively.

The outputs from the terminals Trm[2] to Trm[8] are input to the matrix device 12 through the drive lines Drv[2] to Drv[8]. The outputs from the eight terminals Trm[1] to Trm[8] are also input to the decoder 24.

In addition, the outputs from the terminals Trm[2] to Trm[8] are input to multiplexers 31[1] to 31[7], respectively. The output from the terminal Trm[1] is also input to the multiplexers 31[1] to 31[7], and the multiplexers 31[1] to 31[7] can select and output either the outputs from the terminals Trm[2] to Trm[8] or the output from the terminal Trm[1].

Outputs from the multiplexers 31[1] to 31[7] are input to the element devices 11[1,1] to 11[1,7] through the drive lines Drv[1,1] to Drv[1,7], respectively. To obtain the differences of the second physical quantities of the element devices 11 in the second to eighth rows from the second physical quantities of the element devices 11 in the first row, the multiplexers 31[1] to 31 [7] select the output from the terminal Trm[1].

On the other hand, to obtain the differences of the second physical quantities of the element devices 11[1,1] to 11[1,7] from the second physical quantity of the element device 11[1,0], the multiplexers 31[1] to 31[7] select the outputs from the terminals Trm[2] to Trm[8]. Note that the output from the terminal Trm[1] is input to the element device 11[1,0] through the drive line Drv[1,0].

As is apparent from FIG. 13A, the outputs from the terminals Trm[2] to Trm[8] are input to the element devices 11 in the second to eighth rows through the drive lines Drv[2] to Drv[8] to obtain the differences of the second physical quantities of the element devices 11[1,1] to 11[1,7] from the second physical quantity of the element device 11[1,0]. Here, if the element devices 11 in the second to eighth rows change the first physical quantities of the sense lines Sns, accurate measurement cannot be performed. Therefore, the element devices 11 in the second to eighth rows are preferably designed, as needed, so as not to change the first physical quantities of the sense lines Sns.

Figure 13B:
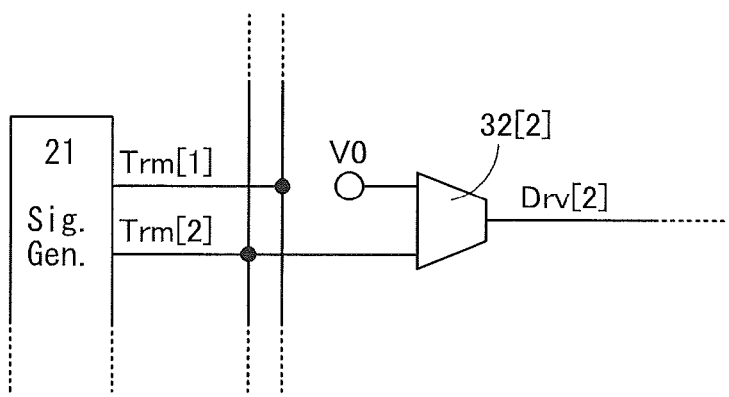

To achieve this, electric elements (the transistors 16) or the like which serve as switches may be provided in the element devices 11 as illustrated in FIG. 2A, for example. Alternatively, either the outputs from the terminals Trm[2] to Trm[8] or a potential V0 may be output from multiplexers 32 to the drive lines Drv as illustrated in FIG. 13B.

In the case where the multiplexers 32 output the potential V0 to the drive lines Drv, and particularly in the case where nonlinear elements such as the magnetic tunnel junction elements 15 are used, current hardly flows even when the potentials of the sense lines Sns are slightly changed from V0, and thus, the same situation as if the transistors 16 were off can be created.

The multiplexers 32 select the outputs from the terminals Trm[2] to Trm[8] to obtain the differences of the second physical quantities of the element devices 11 in the second to eighth rows from the second physical quantities of the element devices 11 in the first row. On the other hand, the multiplexers 32 output the potential V0 to obtain the differences of the second physical quantities of the element devices 11[1,1] to 11[1,7] from the second physical quantity of the element device 11[1,0].

Figure 14:
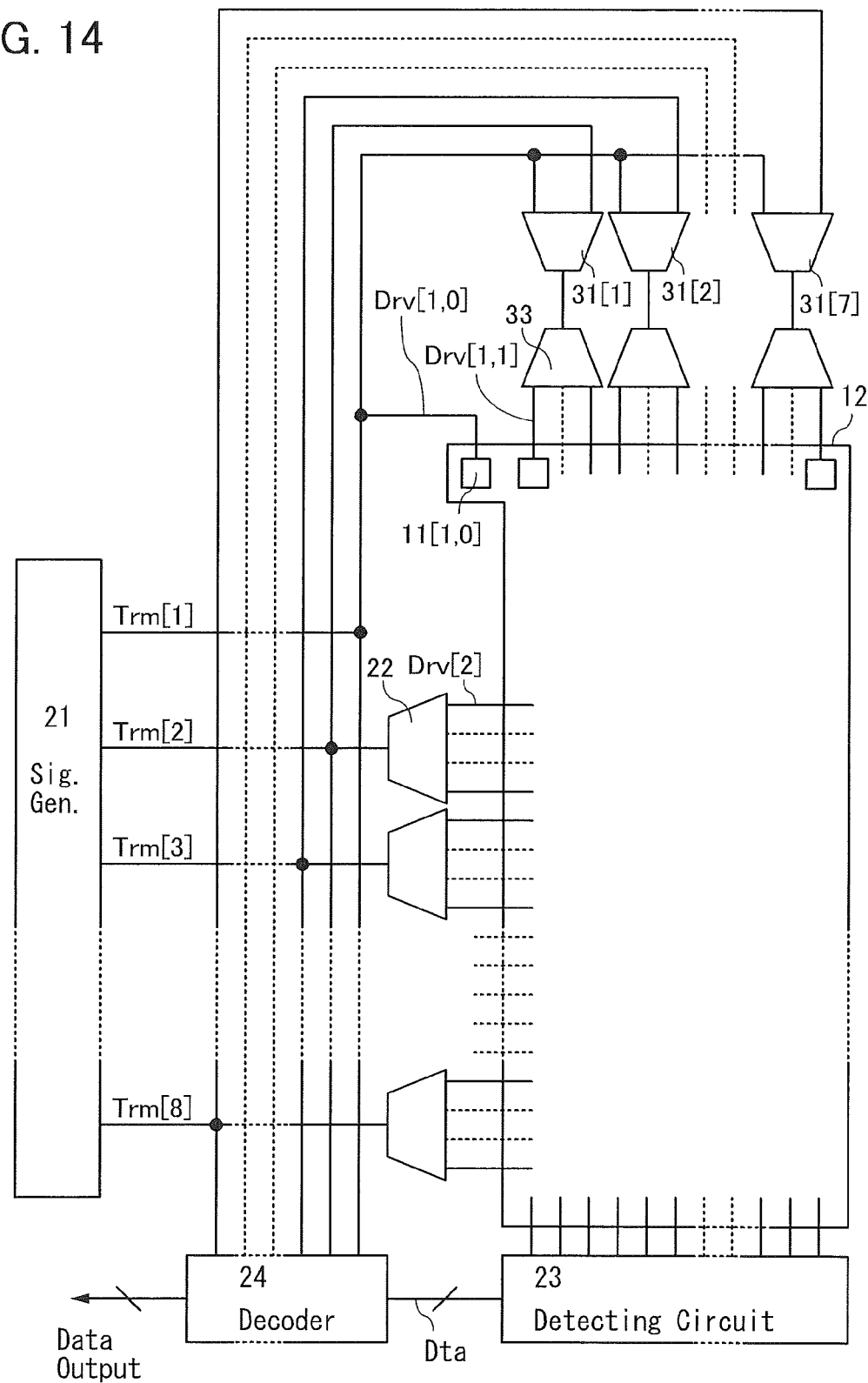
FIG. 14 illustrates a configuration example of an electronic device.

Although the example of the small-scale matrix device with eight rows and seven rows is described above, the same applies to a larger-scale matrix device as described in Embodiment 1. FIG. 14 illustrates an example thereof. In an example of an electronic device illustrated in FIG. 14, each of the outputs from the terminals Trm[2] to Trm[8] of the signal generation circuit 21 is distributed by the demultiplexer 22 to the drive lines Drv as illustrated in FIG. 5. Outputs of the multiplexers 31 are input to demultiplexers 33.

Embodiment 3

The case of using a potential or a voltage as a first physical quantity will be described below. Described here is an example of obtaining the capacitance of the element device 11 by measuring the potential of the sense line Sns.

Figure 15A:
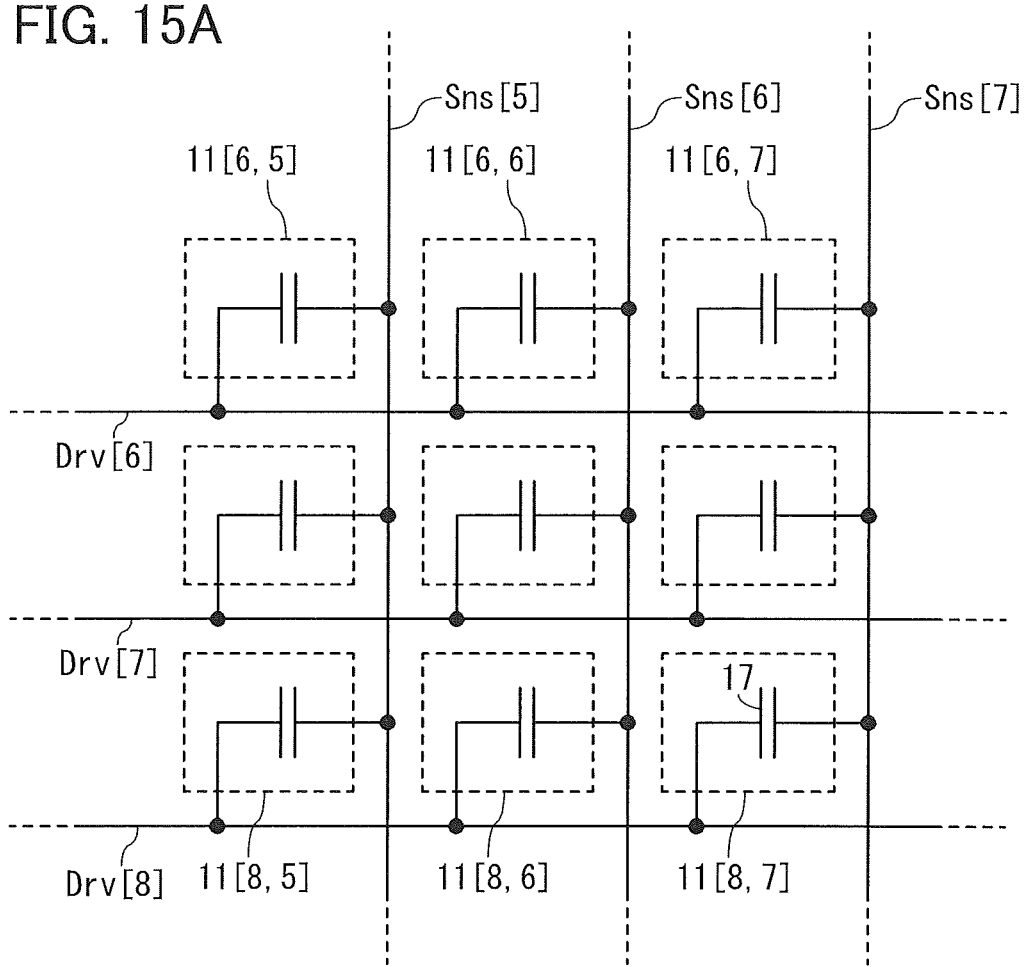
FIGS. 15A and 15B illustrate circuit examples of a matrix device and an element device.

In this example, the element devices 11 each have a structure in which a capacitor 17 is provided at the intersection of the drive line Drv and the sense line Sns as illustrated in FIG. 15A. The capacitor 17 of one element device 11 may differ from that of another element device 11.

For example, the capacitor 17 may have a capacitance which changes when another object approaches, in addition to a capacitance owing to the intersection of the drive line Drv and the sense line Sns. A capacitive touch panel has such a structure.

For example, the capacitor 17 may include a dielectric capable of changing its dielectric constant or capacitance and may serve as a memory cell capable of storing data with a change in dielectric constant or capacitance. Note that a control transistor 16 which can be turned on or off with a word line Wrd (or a switch having a similar function) may be included as illustrated in FIG. 15B.

Figure 15B:
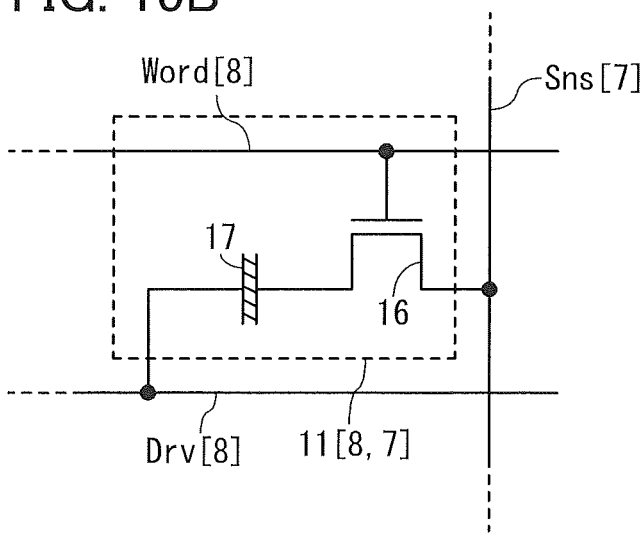

Although a source and a drain of the transistor 16 are between the sense line Sns[7] and the capacitor 17 in FIG. 15B, the source and the drain of the transistor 16 may be between the drive line Drv[8] and the capacitor 17.

When a potential is applied to the drive line Drv, the potential of the sense line Sns (in a floating state) is affected by the potential of the drive line Drv owing to capacitive coupling through the capacitor 17.

For example, a case of the matrix device 10 with eight rows and seven columns in FIG. 1 is considered here in which the sense line Sns[7] is not coupled to any capacitance other than those of the element devices 11[1,7] to 11[8,7]. In an initial state (t=0), both of the potentials of the drive line Drv and the sense line Sns are assumed to be V0.

Next, at t=1, the potential of the sense line Sns[7] is changed by a potential $\Delta V_S[7]_{t=1}$. Assuming that the potentials of the drive lines Drv[1] to Drv[8] are changed by potentials $\Delta V_D[1]_{t=1}$ to $\Delta V_D[8]_{t=1}$, the potential $\Delta V_S[7]_{t=1}$ can be represented, using capacitances c[1,7] to c[8,7] of the capacitors 17[1,7] to 17[8,7], by $$\Delta V_S[7]_{t=1} = \frac{\Delta V_D[1]_{t=1} c[1,7] + \Delta V_D[2]_{t=1} c[2,7] + \ldots + \Delta V_D[8]_{t=1} c[8,7]}{c[1,7] + c[2,7] + \ldots + c[8,7]}.$$

In reality, there is also a capacitance c[0,7] besides those of the capacitors 17. Assuming that the potential of a counter electrode for the capacitance c[0,7] is changed by $\Delta V_p[7]_{t=1}$, the potential $\Delta V_S[7]_{t=1}$ can be represented by $$\Delta V_S[7]_{t=1} = \frac{\Delta V_p[7]_{t=1} c[0,7] + \Delta V_D[1]_{t=1} c[1,7] + \Delta V_D[2]_{t=1} c[2,7] + \ldots + \Delta V_D[8]_{t=1} c[8,7]}{c[0,7] + c[1,7] + c[2,7] + \ldots + c[8,7]}.$$

An example of the capacitance c[0,7] is a capacitance generated with the sense line Sns[6] or another wiring adjacent to the sense line Sns[7].

In the case where the coded signals based on the Hadamard matrix H of order 8 are input to the drive lines Drv as described in Embodiment 1, the potentials $\Delta V_D[1]_{t=1}$ to $\Delta V_D[8]_{t=4}$ can be either VH−V0 or VL−V0 as described in Embodiment 1. It is assumed here that VH+VL=2V0. Since the same applies at times t=2 to t=8, $$\begin{pmatrix} \Delta V_S[7]_{t=1} \\ \Delta V_S[7]_{t=2} \\ \vdots \\ \vdots \\ \Delta V_S[7]_{t=8} \end{pmatrix} = \frac{c[0,7]}{C[7]} \begin{pmatrix} \Delta V_P[7]_{t=1} \\ \Delta V_P[7]_{t=2} \\ \vdots \\ \vdots \\ \Delta V_S[7]_{t=8} \end{pmatrix} + \frac{VH-V0}{C[7]} H \begin{pmatrix} c[1,7] \\ c[2,7] \\ \vdots \\ \vdots \\ c[8,7] \end{pmatrix},$$

where H is the Hadamard matrix of order 8, and $C[7]=c[0,7]+c[1,7]+c[2,7]+\ldots+c[8,7]$.

Hence, according to a method similar to that described in Embodiment 1, $$\begin{pmatrix} c[1,7] \\ c[2,7] \\ \vdots \\ \vdots \\ c[8,7] \end{pmatrix} = \frac{1}{8(VH-V0)} H \begin{pmatrix} C[7]\Delta V_S[7]_{t=1} - c[0,7]\Delta V_P[7]_{t=1} \\ C[7]\Delta V_S[7]_{t=2} - c[0,7]\Delta V_P[7]_{t=2} \\ \vdots \\ \vdots \\ C[7]\Delta V_S[7]_{t=8} - c[0,7]\Delta V_P[7]_{t=8} \end{pmatrix}.$$

Since the capacitance $c[0,7]$ is a capacitance generated with the sense line Sns[6] or another wiring adjacent to the sense line Sns[7] as described above, the potentials $\Delta V_p[7]_{t=1}$ to $\Delta V_p[7]_{t=8}$ correspond to the potential of the sense line Sns[6] or the other wiring. Thus, the potentials $\Delta V_p[7]_{t=1}$ to $\Delta V_p[7]_{t=8}$ might differ from each other.

In the case where $c[0,7]$ is extremely small, this term can be regarded as 0. In the case where there are small differences between the potentials $\Delta V_p[7]_{t=1}$ to $\Delta V_p[7]_{t=8}$, the term can be regarded as a constant. In particular, when the potential changes of the sense line Sns[6] and the other wiring are 0, the term can be regarded as 0. That is, the equation can be approximated as $$\begin{pmatrix} c[1,7] \\ c[2,7] \\ \vdots \\ \vdots \\ c[8,7] \end{pmatrix} = \frac{C[7]}{8(VH-V0)} H \begin{pmatrix} \Delta V_S[7]_{t=1} \\ \Delta V_S[7]_{t=2} \\ \vdots \\ \vdots \\ \Delta V_S[7]_{t=8} \end{pmatrix}.$$

Furthermore, $$\begin{pmatrix} \Delta V_S[7]_{t=1} \\ \Delta V_S[7]_{t=2} \\ \vdots \\ \vdots \\ \Delta V_S[7]_{t=8} \end{pmatrix} = \frac{VH-V0}{C[7]} H \begin{pmatrix} c[1,7] \\ c[2,7] \\ \vdots \\ \vdots \\ c[8,7] \end{pmatrix}.$$

The potential change of the sense line Sns can be prevented by, for example, keeping the potential of the sense lines Sns[2], Sns[4], and Sns[6] at V0 in the case of reading data through the sense lines Sns[1], Sns[3], Sns[5], and Sns[7].

As described in Embodiment 1, the element in the first row and the first column of the Hadamard matrix is 1. Thus, measurement is not performed at time t=1 as in the subsection <Data reading method—Basis> in Embodiment 1. Furthermore, the techniques described in Embodiment 1 or 2 can be modified as appropriate and employed for the matrix device in this embodiment.

In the case where the matrix device 10 is, for example, a capacitive touch panel, it is preferable that any of three values can be read as the potential of the sense line Sns as described in the subsection <Data reading method—Basis> in Embodiment 1. Whether the touch panel is touched or not corresponds to whether a memory device stores data "0" or "1".

In the touch panel, one or an odd number of element devices 11 of the element devices 11 connected to one sense line Sns is/are not necessarily touched, and in some cases, an even number (including 0) of element devices 11 may be touched. If the potential is determined with two values, accurate values cannot be calculated as described in the subsection <Data reading method—Modification 3>. When any of three values can be read, a touch on the touch panel can be surely detected regardless of whether an odd number or an even number of element devices 11 are touched.

When it is known in advance whether the number of element devices 11 touched is an even number or an odd number, the accuracy of criteria for determination can be lowered as described in the subsection <Data reading method—Modification 4>. Specifically, the resolution may be double. This is advantageous in the case where potential changes of the sense lines Sns are small and difficult to measure (as is often the case with touch panels).

In view of this, the process of reading any of three values and the process of reading one of two values may be performed and the results may be compared to identify an element device 11 which is touched. In that case, the accuracy of reading any of three values can be comparable to the accuracy of reading one of two values.

Note that the case where all data are the same as described in the subsection <Data reading method—Modification 1> can be regarded as the case where the touch panel is not touched at all.

When a potential change of the sense line Sns can be measured more precisely, the capacitances of the capacitors 17 in the element devices 11 can also be compared. This enables not only determination of whether the element device 11 is touched or not but also estimation of the touch area. In the case where an object touches a plurality of element devices, its center position and shape can also be estimated or calculated.

This application is based on Japanese Patent Application serial no. 2014-216179 filed with Japan Patent Office on Oct. 23, 2014, the entire contents of which are hereby incorporated by reference.

What is claimed is:

1. An electronic device comprising:
   N first wirings;
   a second wiring intersecting the N first wirings;
   first to N-th element devices provided at intersections of the N first wirings and the second wiring;
   a detecting circuit;
   a decoder; and
   a driver,
   wherein the first to N-th element devices include an n-th element device (n is an integer greater than or equal to 1 and less than or equal to N),
   wherein the detecting circuit is capable of detecting a first physical quantity of the second wiring and transmitting a digital signal obtained by digitizing the first physical quantity to the decoder,
   wherein each of the first to N-th element devices is capable of changing the first physical quantity in accordance with a signal of a corresponding one of the N first wirings, wherein the driver is capable of transmitting coded signals based on a Hadamard matrix to the decoder and the N first wirings, wherein the decoder is capable of performing arithmetic processing with use of the coded signals and the digital signal and calculating a value based on a second physical quantity of the n-th element device, and wherein the value based on the second physical quantity of the n-th element device is calculated as a difference from a value based on a second physical quantity of one of the first to N-th element devices excluding the n-th element device.

2. The electronic device according to claim 1, wherein the Hadamard matrix is created by Sylvester's method and has an order which is greater than or equal to 4 and is a power of 2.

3. The electronic device according to claim 1, wherein the first physical quantity is any one of a current, a potential and a voltage.

4. The electronic device according to claim 1, wherein the second physical quantity is any one of a resistance, a capacitance and a current value.

5. The electronic device according to claim 1,
wherein the decoder comprises first to N-th arithmetic circuits, and
wherein the digital signal and a signal input to one of the N first wirings are input to each of the arithmetic circuits.

6. The electronic device according to claim 1, further comprising a demultiplexer between the driver and the N first wirings.

7. The electronic device according to claim 1, further comprising a delay circuit between the driver and the decoder.

8. The electronic device according to claim 1, wherein each of the element devices is a memory cell capable of storing multi-level data or analog data.

9. The electronic device according to claim 1,
wherein the driver is configured not to output coded signals corresponding to the first column of the Hadamard matrix, and
wherein the detecting circuit is configured not to detect the first physical quantity of the second wiring at that time.

10. A method for an electronic device comprising:
N first wirings;
a second wiring intersecting the N first wirings;
first to N-th element devices (including an n-th element device (n is an integer greater than or equal to 1 and less than or equal to N)) provided at intersections of the N first wirings and the second wiring;
a detecting circuit;
a decoder; and
a driver,
wherein the first to N-th element devices include an n-th element device (n is an integer greater than or equal to 1 and less than or equal to N), wherein the detecting circuit is capable of detecting a first physical quantity of the second wiring and transmitting a digital signal obtained by digitizing the first physical quantity to the decoder, and wherein each of the first to N-th element devices is capable of changing the first physical quantity in accordance with a signal of a corresponding one of the N first wirings, the method comprising:
transmitting coded signals based on a Hadamard matrix from the driver to the decoder and the N first wirings; and
performing arithmetic processing with use of the coded signals and the digital signal and calculating a value based on a second physical quantity of the n-th element device,
wherein the value based on the second physical quantity of the n-th element device is calculated as a difference from a value based on a second physical quantity of one of the first to N-th element devices excluding the n-th element device.

11. The method for the electronic device according to claim 10, wherein the Hadamard matrix is created by Sylvester's method and has an order which is greater than or equal to 4 and is a power of 2.

12. The method for the electronic device according to claim 10, wherein the first physical quantity is any one of a current, a potential and a voltage.

13. The method for the electronic device according to claim 10, wherein the second physical quantity is any one of a resistance, a capacitance and a current value.

14. The method for the electronic device according to claim 10,
wherein the decoder comprises first to N-th arithmetic circuits, and
wherein the digital signal and a signal input to one of the N first wirings are input to each of the arithmetic circuits.

15. The method for the electronic device according to claim 10, wherein the coded signals are transmitted via a demultiplexer to one of the N first wirings.

16. The method for the electronic device according to claim 10, wherein the coded signals are transmitted via a delay circuit to the decoder.

17. The method for the electronic device according to claim 10, wherein each of the element devices is a memory cell capable of storing multi-level data or analog data.

18. The method for the electronic device according to claim 10,
wherein the driver is configured not to output coded signals corresponding to the first column of the Hadamard matrix, and
wherein the detecting circuit is configured not to detect the first physical quantity of the second wiring at that time.

* * * * *